(12) United States Patent
Kang et al.

(10) Patent No.: US 12,451,079 B2
(45) Date of Patent: *Oct. 21, 2025

(54) DISPLAY PANEL AND DISPLAY DEVICE INCLUDING THE SAME

(71) Applicant: LG Display Co., Ltd., Seoul (KR)

(72) Inventors: Min Sung Kang, Paju-si (KR); Hee Jung Hong, Paju-si (KR); Seong Ho Cho, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/598,940

(22) Filed: Mar. 7, 2024

(65) Prior Publication Data

US 2024/0212620 A1   Jun. 27, 2024

Related U.S. Application Data

(63) Continuation of application No. 18/059,772, filed on Nov. 29, 2022, now Pat. No. 11,961,478, which is a
(Continued)

(30) Foreign Application Priority Data

Aug. 27, 2020   (KR) .......................... 10-2020-0108637

(51) Int. Cl.
*G09G 3/3258*   (2016.01)
*G09G 3/3291*   (2016.01)

(52) U.S. Cl.
CPC ......... *G09G 3/3258* (2013.01); *G09G 3/3291* (2013.01); *G09G 2300/0443* (2013.01);
(Continued)

(58) Field of Classification Search
CPC ............... G09G 3/3258; G09G 3/3291; G09G 2300/0443; G09G 2310/0232;
(Continued)

(56) References Cited

U.S. PATENT DOCUMENTS 11,551,615 B2   1/2023   Kang et al.
11,961,478 B2*  4/2024   Kang ................... G09G 3/3258
(Continued)

FOREIGN PATENT DOCUMENTS

CN   107331347 A   11/2017
CN   107343392 A   11/2017
(Continued)

*Primary Examiner* — Tom V Sheng
(74) *Attorney, Agent, or Firm* — Seed Intellectual Property Law Group LLP

(57) ABSTRACT

Disclosed are a display panel and a display device including the same according to an embodiment. A display panel according to the embodiment includes: a display area in which a plurality of first pixels are arranged at a first pixels per inch (PPI); and a sensing area in which a plurality of second pixels are arranged at a second PPI that is lower than the first PPI, wherein the first pixels of the display area and the second pixels of the sensing area are arranged adjacent to each other at a boundary between the display area and the sensing area, the second pixel includes red, green, and blue sub-pixels, and at least one of the red and green sub-pixels of the second pixel is arranged closest to the first pixel.

8 Claims, 41 Drawing Sheets

Related U.S. Application Data continuation of application No. 17/384,429, filed on Jul. 23, 2021, now Pat. No. 11,551,615.

(52) U.S. Cl.
CPC . *G09G 2310/0232* (2013.01); *G09G 2310/08* (2013.01); *G09G 2320/0233* (2013.01); *G09G 2320/0686* (2013.01); *G09G 2330/028* (2013.01); *G09G 2340/0407* (2013.01); *G09G 2360/14* (2013.01); *G09G 2360/16* (2013.01)

(58) Field of Classification Search
CPC ....... G09G 2310/08; G09G 2320/0233; G09G 2320/0686; G09G 2330/028; G09G 2330/08; G09G 2340/0407; G09G 2360/14; G09G 2360/16
USPC ........................................................ 345/694
See application file for complete search history.

(56) References Cited

U.S. PATENT DOCUMENTS

| | | |
|---|---|---|
| 2018/0114566 A1 | 4/2018 | Aoyama et al. |
| 2019/0005884 A1 | 1/2019 | Yoo |
| 2020/0127061 A1 | 4/2020 | Zou |
| 2020/0135147 A1 | 4/2020 | Tang et al. |
| 2020/0152134 A1 | 5/2020 | Lee et al. |
| 2021/0049955 A1 | 2/2021 | Bae et al. |
| 2021/0049980 A1 | 2/2021 | Bae et al. |
| 2021/0065620 A1 | 3/2021 | Yang et al. |
| 2021/0065625 A1 | 3/2021 | Wang et al. |
| 2021/0074207 A1 | 3/2021 | Choi et al. |
| 2021/0090497 A1 | 3/2021 | Tang et al. |
| 2021/0126059 A1 | 4/2021 | Chang et al. |
| 2021/0225245 A1 | 7/2021 | Chen et al. |
| 2021/0241680 A1 | 8/2021 | Ock et al. |
| 2021/0249563 A1* | 8/2021 | Ma ................ H10D 30/0295 |
| 2021/0343222 A1 | 11/2021 | Hei et al. |
| 2021/0358379 A1 | 11/2021 | Li et al. |
| 2021/0367004 A1 | 11/2021 | Gao et al. |
| 2021/0407445 A1 | 12/2021 | Wang et al. |
| 2022/0019757 A1 | 1/2022 | Han et al. |
| 2022/0051641 A1 | 2/2022 | Park et al. |
| 2022/0115456 A1 | 4/2022 | Oh et al. |
| 2022/0139286 A1 | 5/2022 | Lee et al. |
| 2023/0178030 A1* | 6/2023 | Hyun ................ H10K 59/121 345/694 |

FOREIGN PATENT DOCUMENTS

| | | |
|---|---|---|
| CN | 110619813 A | 12/2019 |
| CN | 110634434 A | 12/2019 |
| CN | 110914891 A | 3/2020 |
| KR | 20170049788 A | 5/2017 |

\* cited by examiner

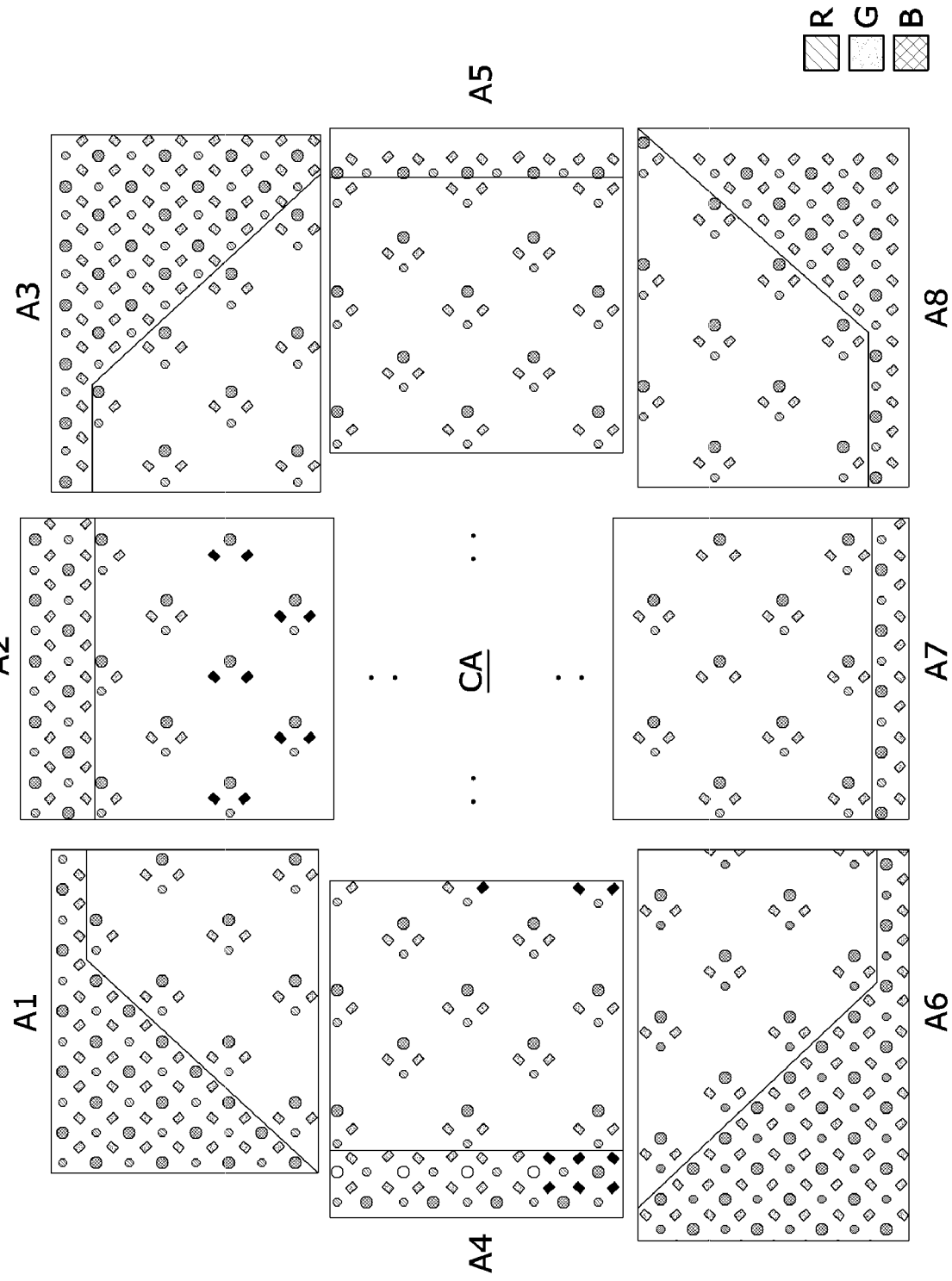

DISPLAY PANEL AND DISPLAY DEVICE INCLUDING THE SAME

CROSS-REFERENCE TO RELATED APPLICATION

This application is a continuation of U.S. patent application Ser. No. 18/059,772, filed Nov. 29, 2022, which is a continuation of U.S. patent application Ser. No. 17/384,429, filed Jul. 23, 2021; which claims the benefit of Korean Patent Application No. 10-2020-0108637 filed on Aug. 27, 2020, the disclosure of which is incorporated herein by reference in its entirety.

BACKGROUND

Technical Field

The present disclosure relates to a display panel and a display device including the same.

Description of the Related Art

Electroluminescent display devices are roughly classified into inorganic light emitting display devices and organic light emitting display devices depending on materials of light emitting layers. Active matrix type organic light emitting display devices include organic light emitting diodes (hereinafter, referred to as "OLEDs") that emit light by themselves and advantageously have a high response speed, a high luminous efficiency, a high luminance, and a wide viewing angle. In the organic light emitting display devices, an OLED is formed in each pixel. The organic light emitting display devices have a high response speed, an improved luminous efficiency, an improved luminance, and an improved viewing angle as well as improved contrast ratio and color reproducibility because black gradations may be expressed as complete black.

Multimedia functions of mobile terminals are being improved. For example, cameras are basically built into smartphones, and the resolution of the cameras is increasing to a level of a conventional digital camera. However, front cameras of the smart phone restrict screen designs, making it difficult to design the screen. In order to reduce spaces occupied by the cameras, screen designs including notches or punch holes have been adopted in the smartphones. However, screen sizes are still limited due to the cameras, and thus full-screen displays cannot be implemented.

In order to implement the full-screen displays, a method has been proposed in which a sensing area in which low-resolution pixels are arranged in a screen of a display panel is provided and a camera is arranged at a position facing the sensing area below the display panel.

The sensing area in the screen is operated as a transparent display displaying an image. Such a sensing area has low transmittance and low luminance due to the pixels arranged with a low-resolution in the sensing area. Thus, a technique may be applied to improve brightness difference and color difference between the low-resolution pixels in the sensing area and high-resolution pixels in an area of the display panel adjacent to the sensing area.

BRIEF SUMMARY

The present disclosure is directed to solving all the above-described and other necessity and problems identified in the related art by the inventors of the present disclosure.

The present disclosure is directed to providing a display panel, in which a luminance difference in a boundary portion may be reduced, and a display device including the same.

It should be noted that technical benefits of the present disclosure are not limited to the above-described technical benefits, and other technical benefits of the present disclosure will be apparent to those skilled in the art from the following descriptions.

A display panel according to the present disclosure includes: a display area in which a plurality of first pixels are arranged at a first pixels per inch (PPI); and a sensing area in which a plurality of second pixels are arranged at a second PPI that is lower than the first PPI, wherein the first pixels of the display area and the second pixels of the sensing area are arranged adjacent to each other at a boundary between the display area and the sensing area, the second pixel includes red, green, and blue sub-pixels, and at least one of the red and green sub-pixels of the second pixel is arranged closest to the first pixel.

BRIEF DESCRIPTION OF THE SEVERAL VIEWS OF THE DRAWINGS

The above and other technical benefits, features and advantages of the present disclosure will become more apparent to those of ordinary skill in the art by describing example embodiments thereof in detail with reference to the accompanying drawings, in which:

FIG. 13 is a view for describing a pixel arrangement structure at the boundary portion of the sensing area according to the embodiment;

DETAILED DESCRIPTION

Figure 1:
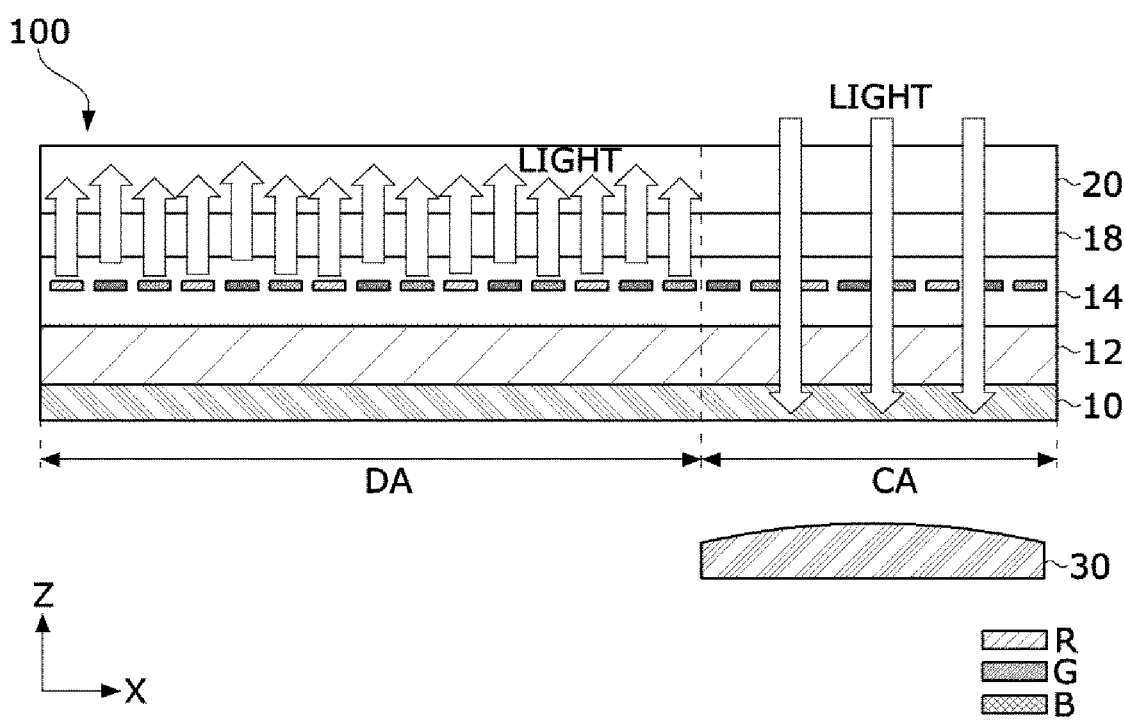
FIG. 1 is a sectional view schematically illustrating a display panel according to an embodiment of the present disclosure.

The advantages and features of the present disclosure and methods for accomplishing the same will be more clearly understood from embodiments described below with reference to the accompanying drawings. However, the present disclosure is not limited to the following embodiments but may be implemented in various different forms. Rather, the present embodiments will make the disclosure of the present disclosure complete and allow those skilled in the art to completely comprehend the scope of the present disclosure.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the present specification. Further, in describing the present disclosure, detailed descriptions of known related technologies may be omitted to avoid unnecessarily obscuring the subject matter of the present disclosure.

The terms such as "comprising," "including," and "having" used herein are generally intended to allow other components to be added unless the terms are used with the term "only." Any references to singular may include plural unless expressly stated otherwise.

According to some embodiments, the term "unit" may include any electrical circuitry, features, components, an assembly of electronic components or the like. That is, "unit" may include any processor-based or microprocessor-based system including systems using microcontrollers, integrated circuit, chip, microchip, reduced instruction set computers (RISC), application specific integrated circuits (ASICs), field-programmable gate arrays (FPGAs), graphical processing units (GPUs), logic circuits, and any other circuit or processor capable of executing the various operations and functions described herein. The above examples are examples only, and are thus not intended to limit in any way the definition or meaning of the term "unit."

In some embodiments, the various units described herein may be included in or otherwise implemented by processing circuitry such as a microprocessor, microcontroller, or the like.

Components are interpreted to include an ordinary error range even if not expressly stated.

When the position relation between two components is described using the terms such as "on," "above," "below," and "next," one or more components may be positioned between the two components unless the terms are used with the term "immediately" or "directly."

The terms "first," "second," and the like may be used to distinguish components from each other, but the functions or structures of the components are not limited by ordinal numbers or component names in front of the components.

The following embodiments can be partially or entirely bonded to or combined with each other and can be linked and operated in technically various ways. The embodiments can be carried out independently of or in association with each other.

Hereinafter, various embodiments of the present disclosure will be described in detail with reference to the accompanying drawings.

In embodiments, a structure is proposed in which a first pixel in a display area in which a plurality of first pixels are arranged at a first pixels per inch (PPI) and a second pixel in a sensing area in which a plurality of second pixels are arranged at a second PPI that is smaller than the first PPI are arranged adjacent to each other at a boundary between the display area and the sensing area, the second pixel includes red, green, and blue sub-pixels, and at least one of a red sub-pixel, a green sub-pixel and a blue sub-pixel of the second pixel is arranged closest to the display area.

In this case, the sensing area includes a camera module and is designed to have a PPI lower than a PPI of the display area.

Figure 2:
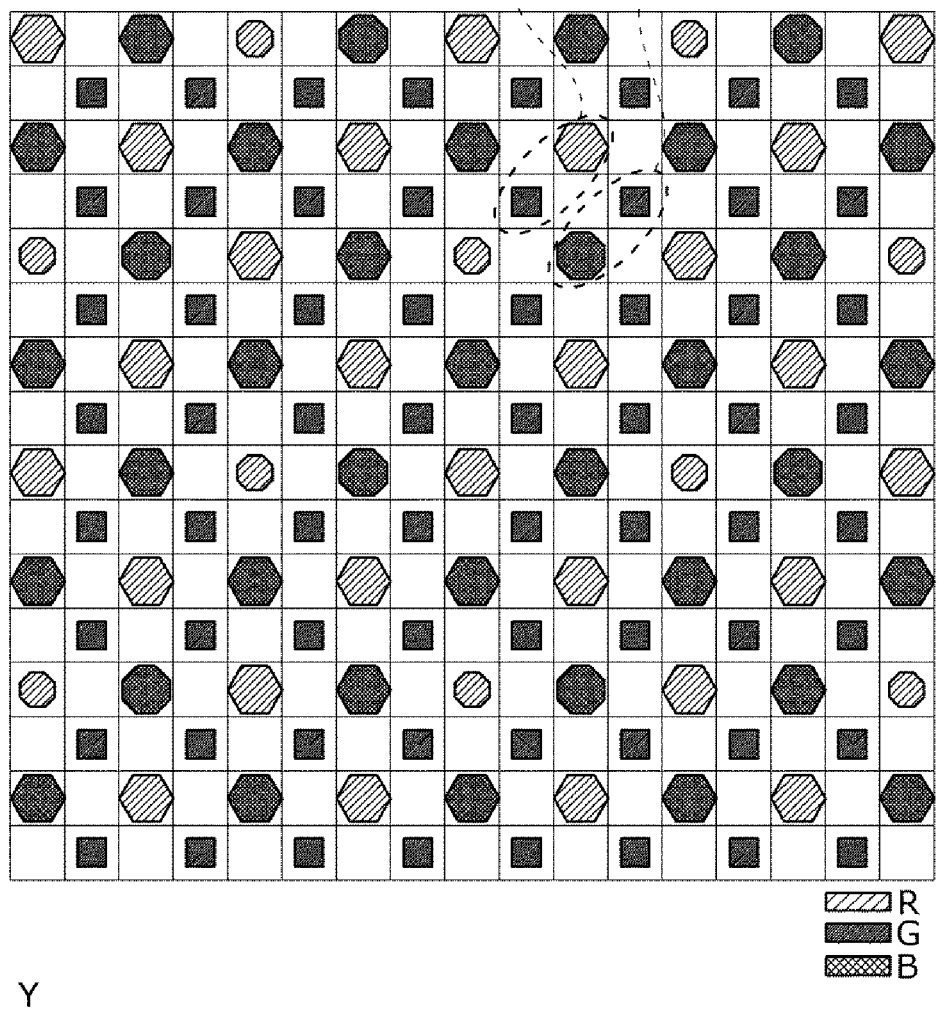
FIG. 2 is a view illustrating an example of pixel arrangement in a display area (DA)
Figure 3:
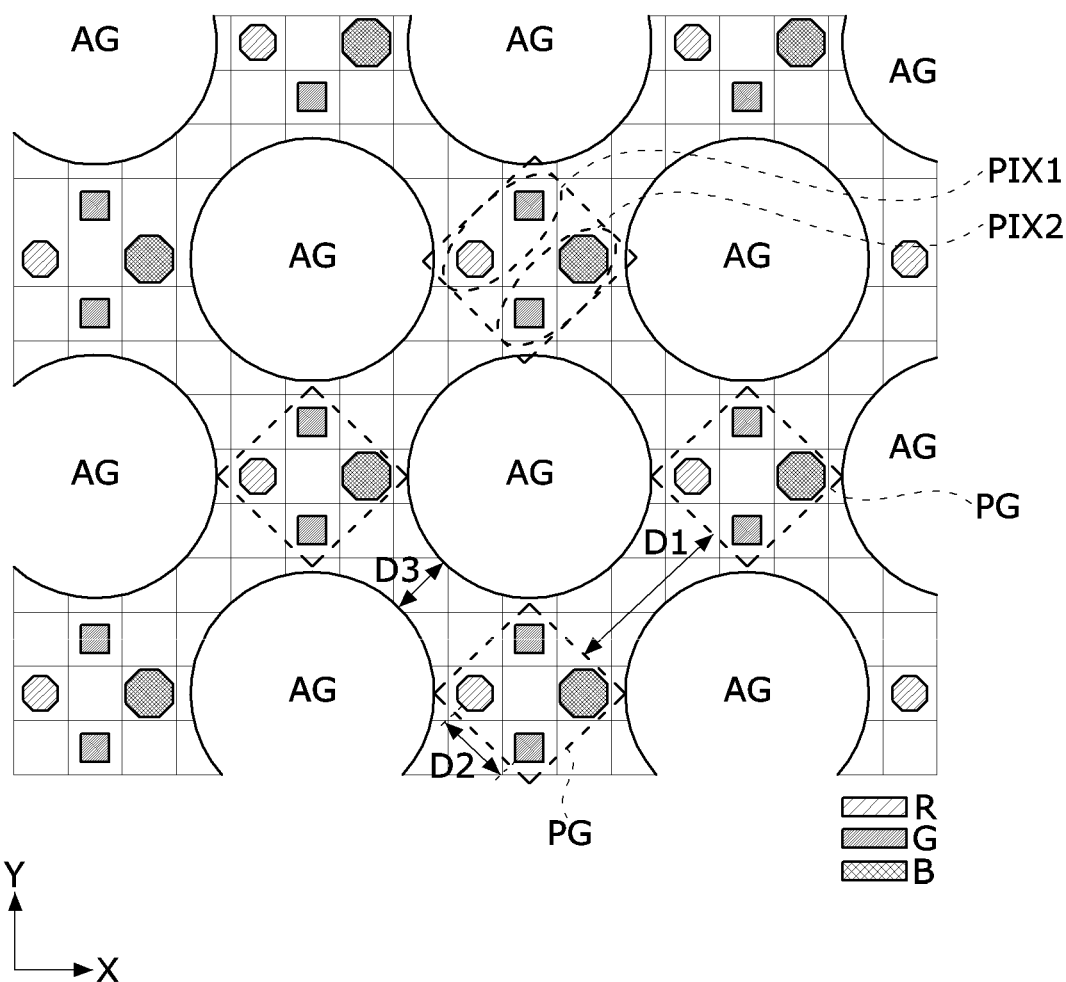
FIG. 3 is a view illustrating an example of a pixel and a light transmitting part in a sensing area (CA)

FIG. 1 is a sectional view schematically illustrating a display panel according to an embodiment of the present disclosure, FIG. 2 is a view illustrating an example of pixel arrangement in a display area DA, and FIG. 3 is a view illustrating an example of a pixel and a light transmitting part in a sensing area CA. In FIGS. 2 and 3, wiring connected to pixels is omitted.

Referring to FIGS. 1 to 3, a screen of a display panel 100 includes at least a display area DA in which first pixels are arranged at a high resolution and a sensing area CA in which second pixels are arranged at a low resolution. Here, the display area in which the first pixels are arranged at the high resolution, that is, a high-resolution area, may include an area in which the first pixels are arranged at a high pixels per inch (PPI), that is, a high PPI area, and the sensing area in which the second pixels are arranged at the low resolution, that is, a low-resolution area, may include an area in which the second pixels are arranged at a low PPI, that is, a low PPI area.

The display area DA and the sensing area CA include a pixel array in which pixels in which pixel data is written are arranged. The number of pixels per unit area, that is, the PPI, of the sensing area CA is lower than the PPI of the display area DA in order to secure the transmittance of the sensing area CA.

The pixel array of the display area DA includes a pixel area (first pixel area) in which a plurality of first pixels having a high PPI are arranged. The pixel array of the sensing area CA includes a pixel area (second pixel area) in which a plurality of second pixel groups PG spaced by the light transmitting part and thus having a relatively low PPI are arranged. In the sensing area CA, external light may pass through the display panel 100 through the light transmitting part having a high light transmittance and may be received by an imaging element module below the display panel 100.

Since the display area DA and the sensing area CA include pixels, an input image is reproduced on the display area DA and the sensing area CA.

Each of the pixels of the display area DA and the sensing area CA include sub-pixels having different colors to realize the color of the image. Sub-pixels include a red sub-pixel (hereinafter, referred to as an "R sub-pixel"), a green sub-pixel (hereinafter, referred to as a "G sub-pixel"), and a blue sub-pixel (hereinafter, referred to as a "B sub-pixel"). Although not illustrated, each of pixels P may further include a white sub-pixel (hereinafter, a "W sub-pixel"). Each of the sub-pixels may include a pixel circuit and a light emitting element OLED.

The sensing area CA includes the pixels and the imaging element module disposed below the screen of the display panel 100. The sensing area above a lens 30 of the imaging element module displays an input image by writing pixel data of the input image in the pixels of the sensing area CA in a display mode. The imaging element module captures an external image in an imaging mode and outputs a picture or moving image data. The lens 30 of the imaging element module faces the sensing area CA. The external light is incident on the lens 30 of the imaging element module, and the lens 30 collects the light in an image sensor that is omitted in the drawings. The imaging element module captures an external image in the imaging mode and outputs a picture or moving image data.

In order to secure the transmittance, an image quality compensation algorithm for compensating for the luminance and color coordinates of pixels in the sensing area CA may be applied due to pixels removed from the sensing area CA.

In the present disclosure, since the low-resolution pixels are arranged in the sensing area CA, a display area of the screen is not limited in relation to the imaging element module, and thus a full-screen display can be implemented.

The display panel 100 has a width in an X-axis direction, a length in a Y-axis direction, and a thickness in a Z-axis direction. The display panel 100 includes a circuit layer 12 disposed on a substrate 10 and a light emitting element layer 14 disposed on the circuit layer 12. A polarizing plate 18 may be disposed on the light emitting element layer 14, and a cover glass 20 may be disposed on the polarizing plate 18.

The circuit layer 12 may include a pixel circuit connected to wirings such as data lines, gate lines, and power lines, a gate drive part connected to the gate lines, and the like. The circuit layer 12 may include circuit elements such as a transistor implemented as a thin film transistor (TFT) and a capacitor. The wirings and circuit elements of the circuit layer 12 may be formed of a plurality of insulating layers, two or more metal layers separated with the insulating layers therebetween, and an active layer including a semiconductor material.

The light emitting element layer 14 may include a light emitting element driven by the pixel circuit. The light emitting element may be implemented as an organic light emitting diode (OLED). The OLED includes an organic compound layer formed between an anode and a cathode. The organic compound layer may include a hole injection layer HIL, a hole transport layer HTL, an emission layer EML, an electron transport layer ETL, and an electron injection layer EIL, but the present disclosure is not limited thereto. When a voltage is applied to the anode and the cathode of the OLED, holes passing through the hole transport layer HTL and electrons passing through the electron transport layer ETL are moved to the emission layer EML to form excitons, and thus visible light is emitted from the emission layer EML. The light emitting element layer 14 may be disposed on pixels that selectively transmit light having red, green, and blue wavelengths and may further include a color filter array.

The light emitting element layer 14 may be covered with a protective film, and the protective film may be covered with an encapsulation layer. The protective layer and the encapsulation layer may have a structure in which an organic film and an inorganic film are alternately stacked. The inorganic film blocks permeation of moisture or oxygen. The organic film planarizes the surface of the inorganic film. When the organic film and the inorganic film are stacked in multiple layers, a movement path of the moisture or oxygen is longer than that of a single layer, and thus the permeation of the moisture/oxygen affecting the light emitting element layer 14 can be effectively blocked.

The polarizing plate 18 may adhere to the encapsulation layer. The polarizing plate 18 improves outdoor visibility of the display device. The polarizing plate 18 reduces an amount of light reflected from the surface of the display panel 100, blocks the light reflected from metal of the circuit layer 12, and thus improves the brightness of pixels. The polarizing plate 18 may be implemented as a polarizing plate, in which a linear polarizing plate and a phase delay film are bonded to each other, or a circular polarizing plate.

In the display panel of the present disclosure, each pixel area of the display area DA and the sensing area CA includes a light shielding layer. The light shielding layer is removed from the light transmitting part of the sensing area to define the light transmitting part. The light shielding layer includes an opening hole corresponding to a light transmitting part area. The light shielding layer is removed from the opening hole. The light shielding layer is formed of a metal or inorganic film having a lower absorption coefficient than that of the metal removed from the light transmitting part with respect to the wavelength of a laser beam used in a laser ablation process of removing a metal layer present in the light transmitting part.

Referring to FIG. 2, the display area DA includes pixels PIX1 and PIX2 arranged in a matrix form. Each of the pixels PIX1 and PIX2 may be implemented as a real type pixel in which the R, G, and B sub-pixels of three primary colors are formed as one pixel. Each of the pixels PIX1 and PIX2 may further include the W sub-pixel that is omitted in the drawings. Further, two sub-pixels may be configured as one pixel using a sub-pixel rendering algorithm. For example, the first pixel PIX1 may be configured as R and G sub-pixels, and the second pixel PIX2 may be configured as B and G sub-pixels. Insufficient color representation in each of the pixels PIX1 and PIX2 may be compensated for by an average value of corresponding color data between adjacent pixels.

Referring to FIG. 3, the sensing area CA includes pixel groups PG spaced apart from each other by a predetermined or selected distance D1 and light transmitting parts AG arranged between the adjacent pixel groups PG. The external light is received by the lens 30 of the imaging element module through the light transmitting parts AG. The light transmitting parts AG may include transparent media having high transmittance without a metal so that light may be incident with minimum light loss. In other words, the light transmitting parts AG may be formed of transparent insulating materials without including metal lines or pixels. The transmittance of the sensing area CA becomes higher as the light transmitting parts AG becomes larger.

The pixel group PG may include one or two pixels. Each of the pixels of the pixel group PG may include two to four sub-pixels. For example, one pixel in the pixel group PG may include R, G, and B sub-pixels or may include two sub-pixels and may further include a W sub-pixel. In an example of FIG. 3, the first pixel PIX1 is configured as R and G sub-pixels, and the second pixel PIX2 is configured as B and G sub-pixels, but the present disclosure is not limited thereto.

A distance D3 between the light transmitting parts AG is smaller than a distance D1 between the pixel groups PG. A distance D2 between the sub-pixels is smaller than the distance D1 between the pixel groups PG.

The shape of the light transmitting parts AG is illustrated as a circular shape in FIG. 3, but the present disclosure is not limited thereto. For example, the light transmitting parts AG may be designed in various shapes such as a circle, an ellipse, and a polygon. The light transmitting parts AG may be defined as areas in the screen from which all metal layers are removed.

Figure 4:
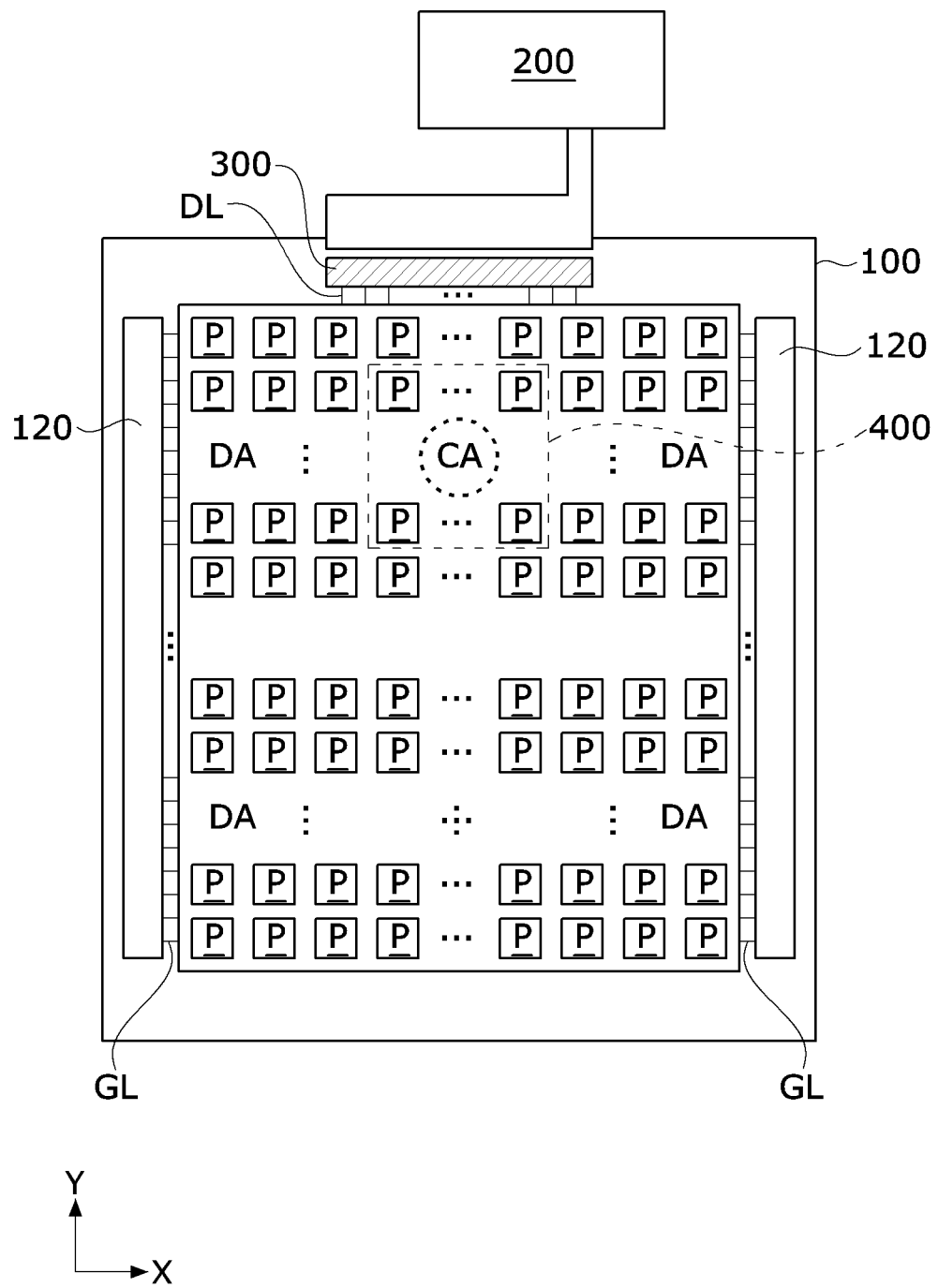
FIG. 4 is a view illustrating the entire configuration of a display device according to the embodiment of the present disclosure.
Figure 5:
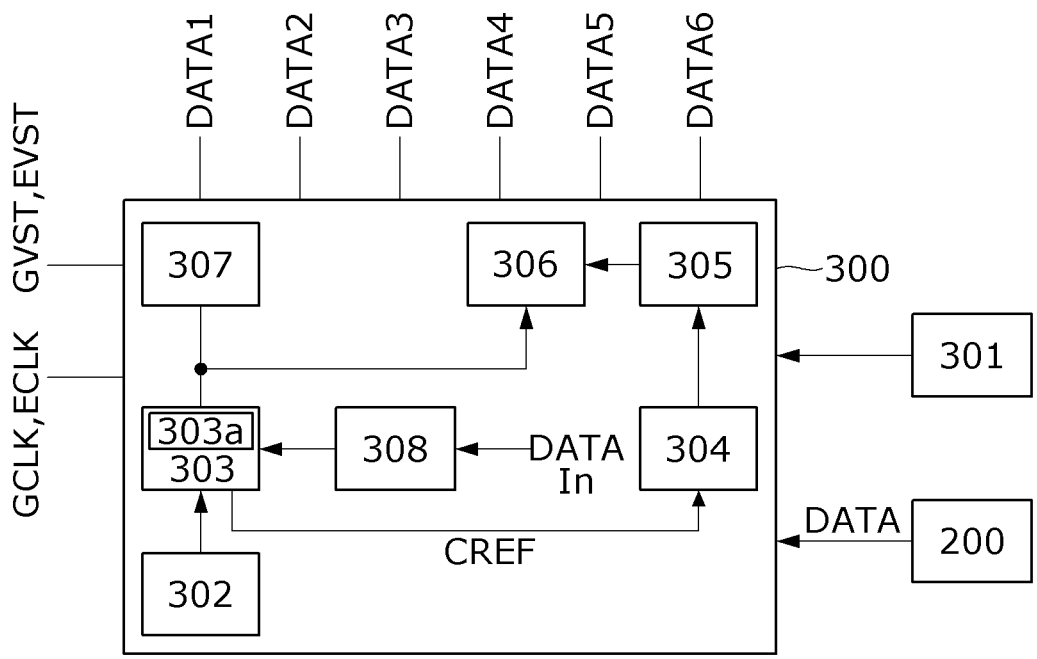
FIG. 5 is a view schematically illustrating a configuration of a drive integrated circuit (IC) illustrated in FIG. 4.

FIG. 4 is a view illustrating the entire configuration of a display device according to the embodiment of the present disclosure, and FIG. 5 is a view schematically illustrating a configuration of a drive integrated circuit (IC) illustrated in FIG. 4.

Referring to FIGS. 4 and 5, the display device includes the display panel 100 in which the pixel array is disposed on the screen, a display panel drive unit, and the like.

The pixel array of the display panel 100 includes data lines DL, gate lines GL intersecting the data lines DL, and pixels P defined by the data lines DL and the gate lines GL and arranged in a matrix form. The pixel array further includes power lines such as a VDD line PL1, a Vini line PL2, and a VSS line PL3 illustrated in FIGS. 6 and 7.

As illustrated in FIG. 1, the pixel array may be divided into the circuit layer 12 and the light emitting element layer 14. A touch sensor array may be disposed on the light emitting element layer 14. Each of the pixels of the pixel array may include two to four sub-pixels as described above. Each of the sub-pixels includes a pixel circuit disposed in the circuit layer 12.

The screen on which the input image is reproduced on the display panel 100 includes the display area DA and the sensing area CA.

Sub-pixels of each of the display area DA and the sensing area CA include pixel circuits. The pixel circuit may include a drive element that supplies a current to the light emitting element OLED, a plurality of switch elements that sample a threshold voltage of the drive element and switch a current path of the pixel circuit, a capacitor that maintains a gate voltage of the drive element, and the like. The pixel circuit is disposed below the light emitting element OLED.

The sensing area CA includes the light transmitting parts AG arranged between the pixel groups PG and an imaging element module 400 disposed below the sensing area CA. The imaging element module 400 photoelectrically converts light incident through the sensing area CA in the imaging mode using the image sensor, converts the pixel data of the image output from the image sensor into digital data, and outputs the captured image data.

The display panel drive unit writes the pixel data of the input image to the pixels P. The pixels P may be interpreted as a pixel group PG including a plurality of sub-pixels.

The display panel drive unit includes a data drive unit 306, which supplies a data voltage of the pixel data to the data lines DL, and a gate drive unit 120 that sequentially supplies a gate pulse to the gate lines GL. The data drive unit 306 may be integrated in a drive IC 300. The display panel drive unit may further include a touch sensor drive unit that is omitted in the drawings.

The drive IC 300 may adhere to the display panel 100. The drive IC 300 receives pixel data of the input image and a timing signal from a host system 200, supplies a data voltage of the pixel data to the pixels, and synchronizes the data drive unit 306 and the gate drive unit 120.

The drive IC 300 is connected to the data lines DL through data output channels to supply the data voltage of the pixel data to the data lines DL. The drive IC 300 may output a gate timing signal for controlling the gate drive unit 120 through gate timing signal output channels. The gate timing signal generated from a timing controller 303 may include a gate start pulse VST, a gate shift clock CKL, and the like. The gate start pulse VST and the gate shift clock CLK swing between a gate-on voltage VGL and a gate-off voltage VGH. The gate timing signals VST and CLK output from a level shifter 307 are applied to the gate drive unit 120 to control a shift operation of the gate drive unit 120.

The gate drive unit 120 may include a shift register formed on the circuit layer of the display panel 100 together with the pixel array. The shift register of the gate drive unit 120 sequentially supplies a gate signal to the gate lines GL under control of the timing controller 303. The gate signal may include a scan pulse and an EM pulse of a light emission signal. The shift register may include a scan drive unit that outputs the scan pulse and an EM drive unit that outputs the EM pulse. In FIG. 5, GVST and GCLK are gate timing signals input to the scan drive unit. EVST and ECLK are gate timing signals input to the EM drive unit.

The drive IC 300 may be connected to the host system 200, a first memory 301, and the display panel 100. The drive IC 300 may include a data reception and calculation unit 308, the timing controller 303, the data drive unit 306, a gamma compensation voltage generation unit 305, a power supply unit 304, a second memory 302, and the like.

The data reception and calculation unit 308 includes a reception unit that receives the pixel data input as a digital signal from the host system 200, and a data calculation unit that processes the pixel data input through the reception unit to improve image quality. The data calculation unit may include a data decoding unit that decodes and restores compressed pixel data, an optical compensation unit that adds a preset optical compensation value to the pixel data, and the like. The optical compensation value may be set as a value for correcting the luminance of each pixel data on the basis of the luminance of the screen measured on the basis of a camera image captured in a manufacturing process.

The timing controller 303 provides, to the data drive unit 306, the pixel data of the input image received from the host system 200. The timing controller 303 generates a gate timing signal for controlling the gate drive unit 120 and a source timing signal for controlling the data drive unit 306 to control the operation timing of the gate drive unit 120 and the data drive unit 306.

In the embodiments, a timing controller 303 may include a data compensation unit 303a. To improve the luminance difference, for example, a bright line, occurring at the boundary between the display area DA and the sensing area CA, the data compensation unit 303a may compensate for, using a compensation gain, input data to be written in each sub-pixel of the display area DA and the sensing area CA arranged adjacent to the boundary.

The power supply unit 304 generates, using a direct current (DC-DC) converter, power required for driving the pixel array of the display panel 100, the gate drive unit 120, and the drive IC 300. The DC-DC converter may include a charge pump, a regulator, a Buck converter, a boost converter, and the like. The power supply unit 304 may adjust a DC input voltage received from the host system 200 to generate a DC power such as the reference voltage, the gate-on voltage VGL, the gate-off voltage VGH, a pixel drive voltage VDD, a low-potential power supply voltage VSS, and an initialization voltage Vini. The reference voltage is supplied to the gamma compensation voltage generation unit 305. The gate-on voltage VGL and the gate-off voltage VGH are supplied to the level shifter 307 and the gate drive unit 120. Pixel powers, such as the pixel drive voltage VDD, the low-potential power supply voltage VSS, and the initialization voltage *Vini*, are commonly supplied to the pixels P. The initialization voltage *Vini* is set to a DC voltage that is lower than the pixel drive voltage VDD and lower than a threshold voltage of the light emitting element OLED to initialize main nodes of the pixel circuits and suppress light emission of the light emitting element OLED.

The gamma compensation voltage generation unit 305 divides the reference voltage supplied from the power supply unit 304 through a divider circuit to generate a gradation-specific gamma compensation voltage. The gamma compensation voltage is an analog voltage that is set for each gradation of the pixel data. The gamma compensation voltage output from the gamma compensation voltage generation unit 305 is provided to the data drive unit 306.

The data drive unit 306 converts digital data including the pixel data received from the timing controller 303 into a gamma compensation voltage through a digital-to-analog converter (DAC) and outputs the data voltage. The data voltage output from the data drive unit 306 is supplied to the data lines DL of the pixel array through an output buffer connected to a data channel of the drive IC 300.

When power is input to the drive IC 300, the second memory 302 stores a compensation value, register setting data, and the like received from the first memory 301. The compensation value may be applied to various algorithms for improving image quality. The compensation value may include an optical compensation value. The register setting data defines operations of the data drive unit 306, the timing controller 303, the gamma compensation voltage generation unit 305, and the like. The first memory 301 may include a flash memory. The second memory 302 may include a static random access memory (SRAM).

The host system 200 may be implemented as an application processor (AP). The host system 200 may transmit pixel data of the input image to the drive IC 300 through a mobile industry processor interface (MIPI). The host system 200 may be connected to the drive IC 300 through a flexible printed circuit (FPC).

Meanwhile, the display panel 100 may be implemented as a flexible panel that may be applied to a flexible display. In the flexible display, the size of the screen may be changed by winding, folding, and bending the flexible panel, and the flexible display may be easily manufactured in various designs. The flexible display may be implemented as a rollable display, a foldable display, a bendable display, a slidable display, and the like. The flexible panel may be manufactured as a so-called "plastic OLED panel." The plastic OLED panel may include a back plate and a pixel array on an organic thin film bonded to the back plate. The touch sensor array may be formed on the pixel array.

The back plate may be a polyethylene terephthalate (PET) substrate. The pixel array and the touch sensor array may be formed on the organic thin film. The back plate may block permeation of moisture toward the organic thin film so that the pixel array is not exposed to the moisture. The organic thin film may be a polyimide (PI) substrate. A multi-layered buffer film may be formed of an insulating material that is not illustrated on the organic thin film. The circuit layer 12 and the light emitting element layer 14 may be stacked on the organic thin film.

In the display device of the present disclosure, the pixel circuit, the gate drive unit, and the like arranged on the circuit layer 12 may include a plurality of transistors. The transistors may be implemented as an oxide TFT including an oxide semiconductor, a low temperature poly silicon (LTPS) TFT including an LTPS, and the like. The transistors may be implemented as a p-channel TFT or an n-channel TFT. In the embodiment, an example in which the transistors of the pixel circuit are implemented as the p-channel TFTs is mainly described, but the present disclosure is not limited thereto.

The transistor is a three-electrode element including a gate, a source, and a drain. The source is an electrode through which a carrier is supplied to the transistor. In the transistor, the carrier starts to flow from the source. The drain is an electrode through which the carrier moves to the outside of the transistor. In the transistor, the carrier flows from the source to the drain. In an n-channel transistor, since the carrier is an electron, a source voltage is lower than a drain voltage so that the electron may flow from the source to the drain. In the n-channel transistor, a current flows from the drain to the source. In a p-channel transistor PMOS, since the carrier is a hole, the source voltage is higher than the drain voltage so that the hole flows from the source to the drain. In the p-channel transistor, since the hole flows from the source to the drain, the current flows from the source to the drain. It should be noted that the source and the drain of the transistor are not fixed. For example, the source and the drain may be changed according to an applied voltage. Thus, the present disclosure is not limited in relation to the source and the drain of the transistor. In the following description, the source and the drain of the transistor will be referred to as first and second electrodes.

The gate pulse swings between the gate-on voltage and the gate-off voltage. The gate-on voltage is set to a voltage higher than a threshold voltage of the transistor, and the gate-off voltage is set to a voltage lower than the threshold voltage of the transistor. The transistor is turned on in response to the gate-on voltage and is turned off in response to the gate-off voltage. In the n-channel transistor, the gate-on voltage may be a gate high voltage VGH, and the gate-off voltage may be a gate low voltage VGL. In the p-channel transistor, the gate-on voltage may be the gate low voltage VGL, and the gate-off voltage may be the gate high voltage VGH.

The drive element of the pixel circuit may be implemented as a transistor. In the drive element, electrical characteristics between all pixels should be uniform but may be different due to process deviations and element characteristic deviations and may vary as a display driving time elapses. In order to compensate for the electrical characteristic deviations, the display device may include an internal compensation circuit and an external compensation circuit. The internal compensation circuit samples a threshold voltage Vth and/or mobility of the drive element, which is added to the pixel circuit in each of the sub-pixels and changes according to electrical characteristics of the drive element and compensates for the change in real time. The external compensation circuit transmits, to an external compensation unit, the threshold voltage and/or mobility of the drive element detected through a sensing line connected to each of the sub-pixels. A compensation unit of the external compensation circuit compensates for changes in electric characteristics of the drive element by modulating the pixel data of the input image by reflecting the sensing result. The voltage of the pixel that changes according to electrical characteristics of an external compensation drive element is detected, and an external circuit modulates the data of the input image on the basis of the detected voltage, thereby compensating for electrical characteristic deviation of the drive element between the pixels.

Figure 6:
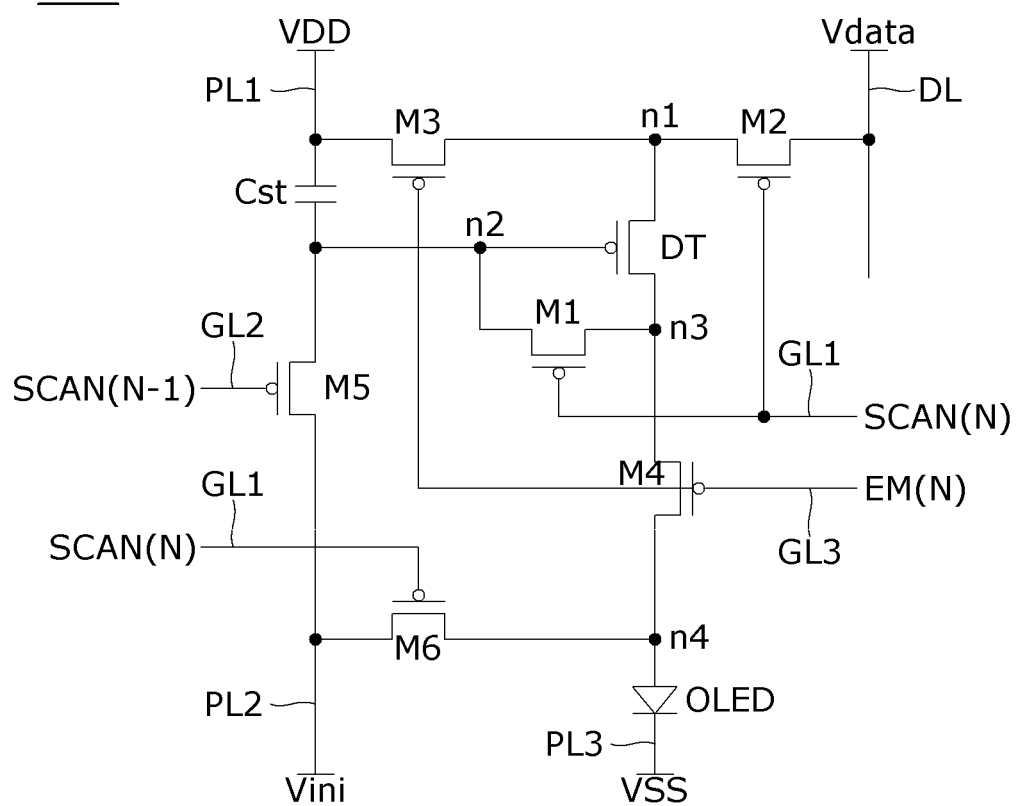
FIGS. 6 and 7 are circuit diagrams illustrating an example of a pixel circuit to which an internal compensation circuit is applied.
Figure 7:
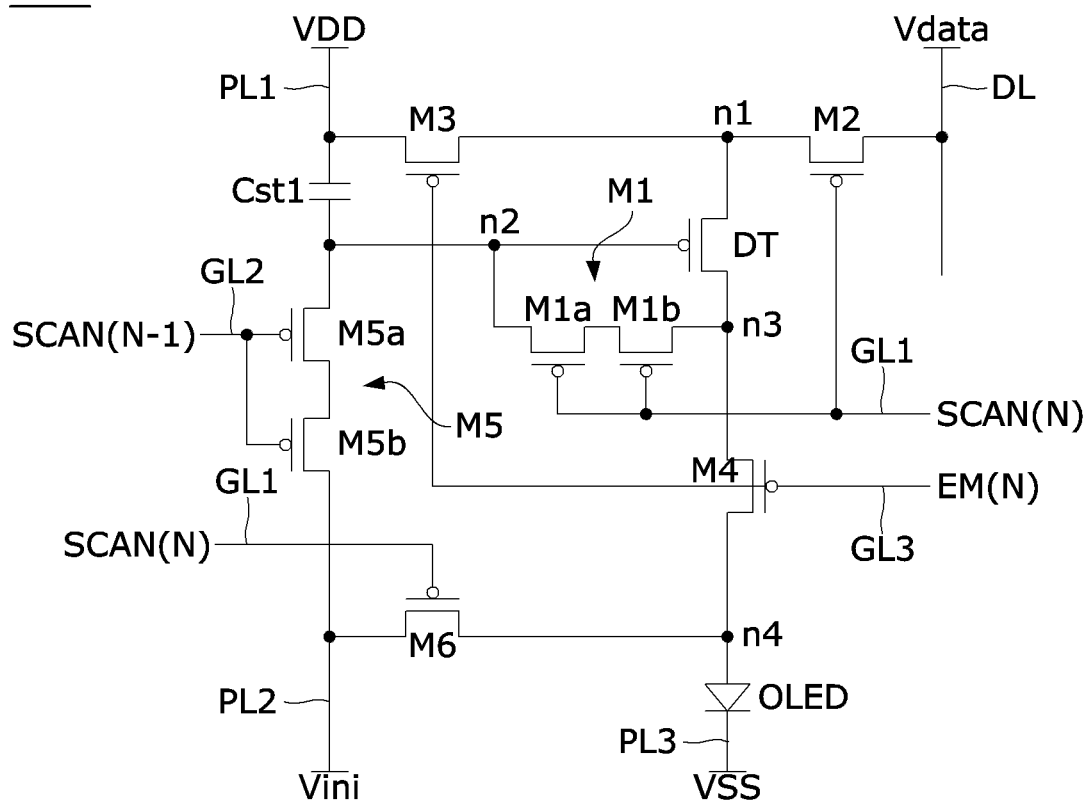
Figure 8:
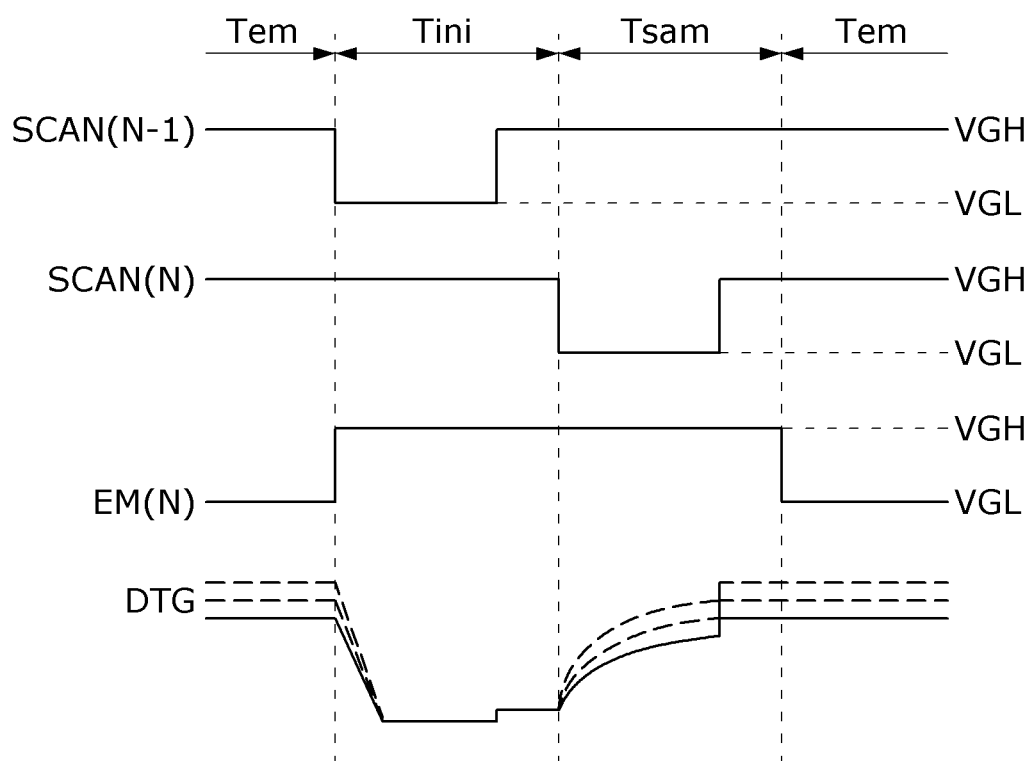
FIG. 8 is a view illustrating a method of driving the pixel circuit illustrated in FIGS. 6 and 7.

FIGS. 6 and 7 are circuit diagrams illustrating an example of a pixel circuit to which an internal compensation circuit is applied. FIG. 8 is a view illustrating a method of driving the pixel circuit illustrated in FIGS. 6 and 7. It should be noted that the pixel circuit of the present disclosure is not limited to FIGS. 6 and 7. The pixel circuit illustrated in FIGS. 6 and 7 may be equally applied to the pixel circuits of the display area DA and the sensing area CA. The pixel circuit applicable to the present disclosure may be implemented as a circuit illustrated in FIGS. 6 and 7, but the present disclosure is not limited thereto.

Referring to FIGS. 6 to 8, the pixel circuit includes the light emitting element OLED, a drive element DT that supplies a current to the light emitting element OLED, and an internal compensation circuit that samples the threshold voltage Vth of the drive element DT using a plurality of switch elements M1 to M6 and compensates for a gate voltage of the drive element DT by the threshold voltage Vth of the drive element DT. Each of the drive element DT and the switch elements M1 to M6 may be implemented as a p-channel TFT.

As illustrated in FIG. 8, a drive period of the pixel circuit using the internal compensation circuit may be divided into an initialization period Tini, a sampling period Tsam, and a light emission period Tem.

During the initialization period Tini, a $(N-1)^{th}$ scanning pulse SCAN(N-1) is generated as a pulse of the gate-on voltage VGL, and a voltage of each of a $N^{th}$ scanning pulse SCAN(N) and a light emission pulse EM(N) is the gate-off voltage VGH. During the sampling period Tsam, the $N^{th}$ scanning pulse SCAN(N) is generated as the pulse of the gate-on voltage VGL, and a voltage of each of the $(N-1)^{th}$ scanning pulse SCAN(N-01) and the light emission pulse EM(N) is the gate-off voltage VGH. During at least a part of the light emission period Tem, the light emission pulse EM(N) is generated as the gate-on voltage VGL, and a voltage of each of the $(N-1)^{th}$ scanning pulse SCAN(N-1) and the $N^{th}$ scanning pulse SCAN(N) is generated as the gate-off voltage VGH.

During the initialization, the fifth switch element M5 is turned on according to the gate-on voltage VGL of the $(N-1)^{th}$ scanning pulse SCAN(N-1) so as to initialize the pixel circuit. During the sampling period Tsam, the first and second switch elements M1 and M2 are turned on according to the gate-on voltage VGL of the $N^{th}$ scanning pulse SCAN(N), and thus a threshold voltage of the drive element DT is sampled and stored in a storage capacitor Cst1. At the same time, the sixth switch element M6 is turned on during the sampling period Tsam to lower the voltage of a fourth node n4 to a reference voltage Vref so as to suppress light emission of the light emitting element OLED. During the light emission period Tem, the third and fourth switch elements M3 and M4 are turned on, and thus the light emitting element OLED emits light. In the light emission period Tem, in order to precisely express the luminance of a low gradation with a duty ratio of the light emission pulse EM(N), the light emission pulse EM(N) swings at a predetermined or selected duty ratio between the gate-on voltage VGL and the gate-off voltage VGH, and thus the third and fourth switch elements M3 and M4 may be repeatedly turned on and off.

The light emitting element OLED may be implemented as an OLED or an inorganic light emitting diode. Hereinafter, an example in which the light emitting element OLED is implemented as an OLED will be described.

The light emitting element OLED may include an organic compound layer formed between an anode and a cathode. The organic compound layer may include a hole injection layer HIL, a hole transport layer HTL, an emission layer EML, an electron transport layer ETL, and an electron injection layer EIL, but the present disclosure is not limited thereto. When a voltage is applied to an anode electrode and a cathode electrode of the OLED, holes passing through the hole transport layer HTL and electrons passing through the electron transport layer ETL are moved to the emission layer EML to form excitons, and thus visible light is emitted from the emission layer EML.

The anode electrode of the light emitting element OLED is connected to the fourth node n4 between the fourth and sixth switch elements M4 and M6. The fourth node n4 is connected to the anode of the light emitting element OLED, a second electrode of the fourth switch element M4, and a second electrode of the sixth switch element M6. The cathode electrode of the light emitting element OLED is connected to a VSS line PL3 to which the low-potential power supply voltage VSS is applied. The light emitting element OLED emits light with a current Ids that flows due to a gate-source voltage Vgs of the drive element DT. A current path of the light emitting element OLED is switched by the third and fourth switch elements M3 and M4.

The storage capacitor Cst1 is connected between the VDD line PL1 and a first node n1. A data voltage Vdata compensated for by the threshold voltage Vth of the drive element DT is charged to the storage capacitor Cst1. Since the data voltage in each of the sub-pixels is compensated for by the threshold voltage Vth of the drive element DT, deviations in characteristics of the drive element DT are compensated for in the sub-pixels.

The first switch element M1 is turned on in response to the gate-on voltage VGL of the $N^{th}$ scanning pulse SCAN(N) to connect a second node n2 and a third node n3. The second node n2 is connected to a gate electrode of the drive element DT, a first electrode of the storage capacitor Cst1, and a first electrode of the first switch element M1. The third node n3 is connected to a second electrode of the drive element DT, a second electrode of the first switch element M1, and a first electrode of the fourth switch element M4. A gate electrode of the first switch element M1 is connected to a first gate line GL1 to receive the $N^{th}$ scanning pulse SCAN(N). The first electrode of the first switch element M1 is connected to the second node n2, and the second electrode of the first switch element M1 is connected to the third node n3.

In some embodiments, since the first switch element M1 is turned on only during a very short horizontal period 1H in which the $N^{th}$ scanning pulse SCAN(N) is generated as the gate-on voltage VGL in one frame period and thus maintains an OFF state for approximately one frame period, a leakage current may occur in the OFF state of the first switch element M1. In order to suppress the leakage current of the first switch element M1, as illustrated in FIG. 7, the first switch element M1 may be implemented as a transistor having a dual gate structure in which two transistors M1$a$ and M1$b$ are connected in series.

The second switch element M2 is turned on in response to the gate-on voltage VGL of the $N^{th}$ scanning pulse SCAN (N) to supply the data voltage Vdata to the first node n1. A gate electrode of the second switch element M2 is connected to the first gate line GL1 to receive the Ni scanning pulse SCAN(N). A first electrode of the second switch element M2 is connected to the first node n1. A second electrode of the second switch element M2 is connected to the data lines DL to which the data voltage Vdata is applied. The first node n1 is connected to the first electrode of the second switch element M2, a second electrode of the third switch element M3, and a first electrode of the drive element DT.

The third switch element M3 is turned on in response to the gate-on voltage VGL of the light emission pulse EM(N) to connect the VDD line PL1 to the first node n1. A gate electrode of the third switch element M3 is connected to a third gate line GL3 to receive the light emission pulse EM(N). A first electrode of the third switch element M3 is connected to the VDD line PL1. The second electrode of the third switch element M3 is connected to the first node n1.

The fourth switch element M4 is turned on in response to the gate-on voltage VGL of the light emission pulse EM(N) to connect the third node n3 to the anode of the light emitting element OLED. A gate electrode of the fourth switch element M4 is connected to the third gate line GL3 to receive the light emission pulse EM(N). The first electrode of the fourth switch element M4 is connected to the third node, and the second electrode thereof is connected to the fourth node n4.

The fifth switch element M5 is turned on in response to the gate-on voltage VGL of the $(N-1)^{th}$ scanning pulse SCAN(N-1) to connect the second node to the Vini line PL2. A gate electrode of the fifth switch element M5 is connected to the second gate line GL2 to receive the $(N-1)^{th}$ scanning pulse SCAN(N-1). A first electrode of the fifth switch element M5 is connected to the second node n2, and a second electrode thereof is connected to the Vini line PL2. In order to suppress the leakage current of the fifth switch element M5, as illustrated in FIG. 7, the fifth switch element M5 may be implemented as a transistor having a dual gate structure in which two transistors M5a and M5b are connected in series.

The sixth switch element M6 is turned on in response to the gate-on voltage VGL of the $N^{th}$ scanning pulse SCAN (N) to connect the Vini line PL2 to the fourth node n4. A gate electrode of the sixth switch element M6 is connected to the first gate line GL1 to receive the Ni scanning pulse SCAN (N). A first electrode of the sixth switch element M6 is connected to the Vini line PL2, and the second electrode thereof is connected to the fourth node n4.

The drive element DT drives the light emitting element OLED by adjusting the current Ids flowing in the light emitting element OLED according to the gate-source voltage Vgs. The drive element DT includes a gate connected to the second node n2, the first electrode connected to the first node, and the second electrode connected to the third node n3.

During the initialization period Tini, as illustrated in FIG. 8, the $(N-1)^{th}$ scanning pulse SCAN(N-1) is generated as the gate-on voltage VGL. During the initialization period Tini, the $N^{th}$ scanning pulse SCAN(N) and the light emission pulse EM(N) maintains the gate-off voltage VGH. Thus, during the initialization period Tini, the fifth switch element M5 is turned on, and thus the second and fourth nodes n2 and n4 are initialized to the initialization voltage Vini. A hold period Th may be set between the initialization period Tini and the sampling period Tsam. In the hold period Th, the gate pules SCAN(N-1), SCAN(N), and EM(N) maintain previous states thereof.

During the sampling period Tsam, the $N^{th}$ scanning pulse SCAN(N) is generated as the gate-on voltage VGL. The pulse of the $N^{th}$ scanning pulse SCAN(N) is synchronized with the data voltage Vdata of a $N^{th}$ pixel line. During the sampling period Tsam, the $(N-1)^{th}$ scanning pulse SCAN (N-1) and the light emission pulse EM(N) maintain the gate-off voltage VGH. Thus, during the sampling period Tsam, the first and second switch elements M1 and M2 are turned on.

During the sampling period Tsam, a gate voltage DTG of the drive element DT is increased by a current flowing through the first and second switch elements M1 and M2. When the drive element DT is turned off, the gate node voltage DTG is Vdata-|Vth|. In this case, the voltage of the first node n1 is Vdata-|Vth|. During the sampling period Tsam, the gate-source voltage Vgs of the drive element DT is |Vgs|=Vdata-(Vdata-|Vth|)=|Vth|.

During the light emission period Tem, the light emission pulse EM(N) may be generated as the gate-on voltage VGL. During the light emission period Tem, in order to improve low gradation expression, the light emission pulse EM(N) is turned on and off at a predetermined or selected duty ratio and thus may swing between the gate-on voltage VGL and the gate-off voltage VGH. Thus, during at least a part of the light emission period Tem, the light emission pulse EM(N) may be generated as the gate-on voltage VGL.

When the light emission pulse EM(N) is the gate-on voltage VGL, a current flows between the VDD and the light emitting element OLED, and thus the light emitting element OLED may emit light. During the light emission period Tem, the $(N-1)^{th}$ and $N^{th}$ scanning pulses SCAN(N-1) and SCAN(N) maintain the gate-off voltage VGH. During the light emission period Tem, the third and fourth switch elements M3 and M4 are repeatedly turned on and off according to the voltage of the light emission signal EM. When the light emission pulse EM(N) is the gate-on voltage VGL, the third and fourth switch elements M3 and M4 are turned on, and thus the current flows in the light emitting element OLED. In this case, Vgs of the drive element DT is |Vgs|=VDD-(Vdata-|Vth|), and the current flowing in the light emitting element OLED is $K(VDD-Vdata)^2$. K denotes a constant value determined by the charge mobility, the parasitic capacitance, the channel capacity, and the like of the drive element DT.

Figure 9:
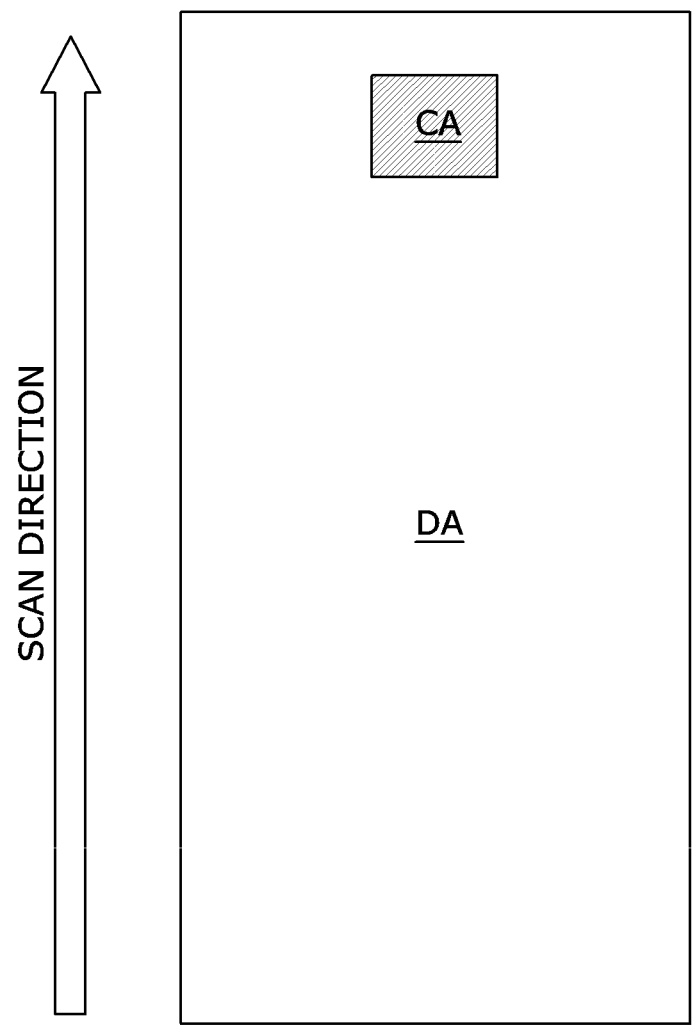
FIG. 9 is a view illustrating a screen including the display area and the sensing area according to the embodiment.
Figure 10A:
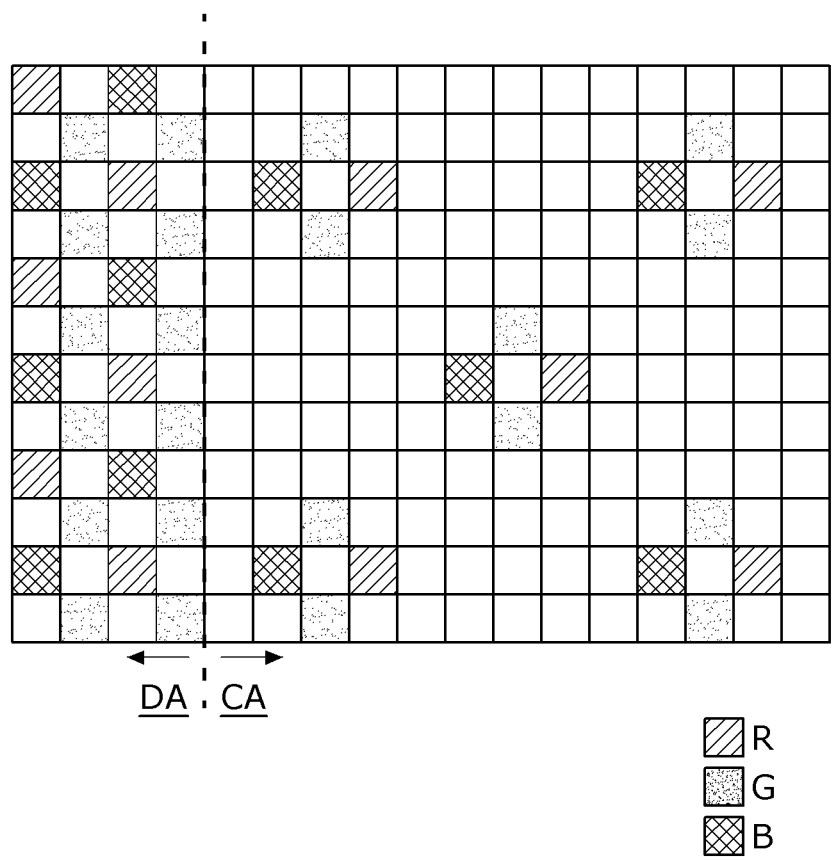
FIGS. 10A to 10C are views for describing a principle of arranging pixels at a boundary portion of the sensing area.
Figure 10B:
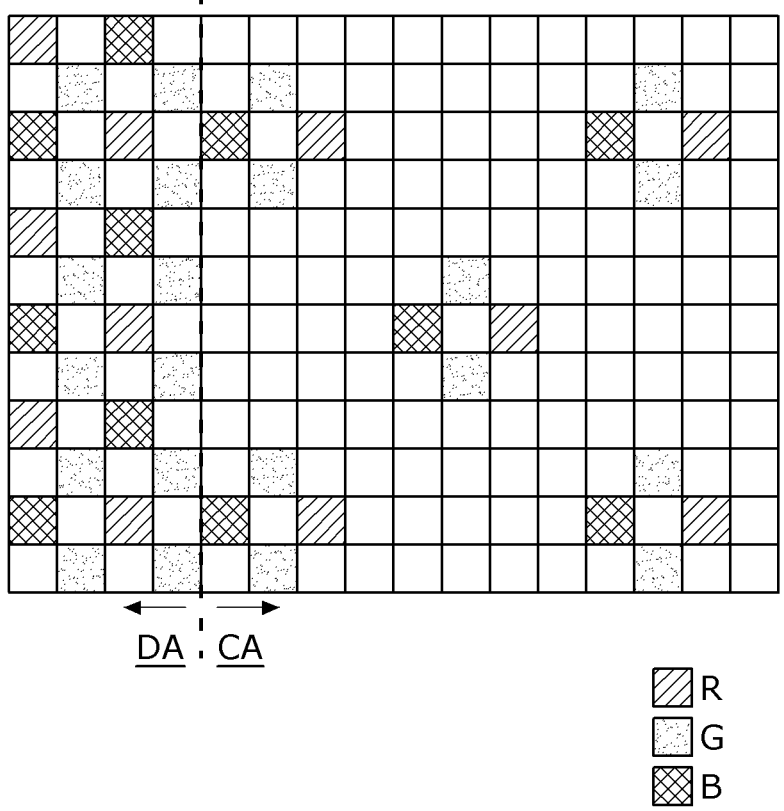
Figure 10C:
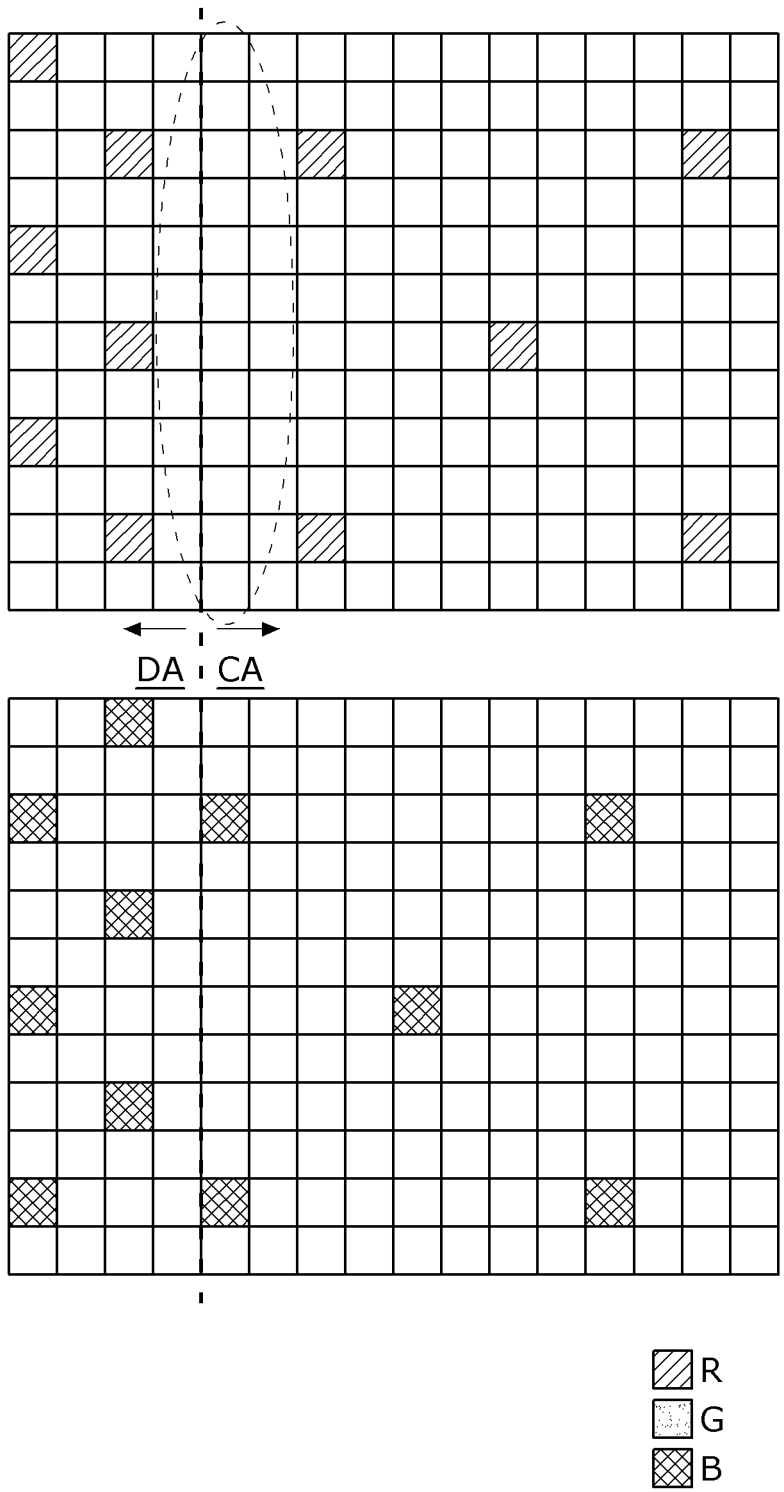
Figure 11A:
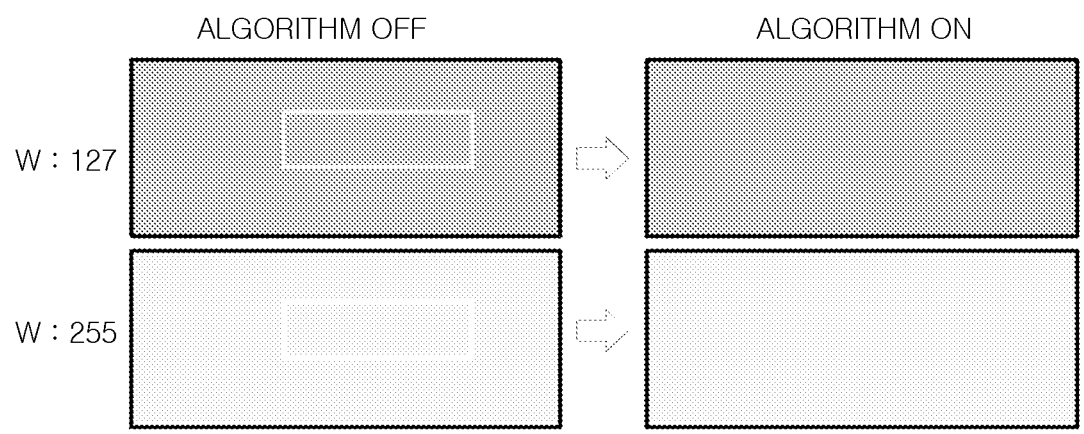
FIGS. 11A and 11B are views for describing a problem occurring in a pixel structure of FIG. 10A.
Figure 11B:
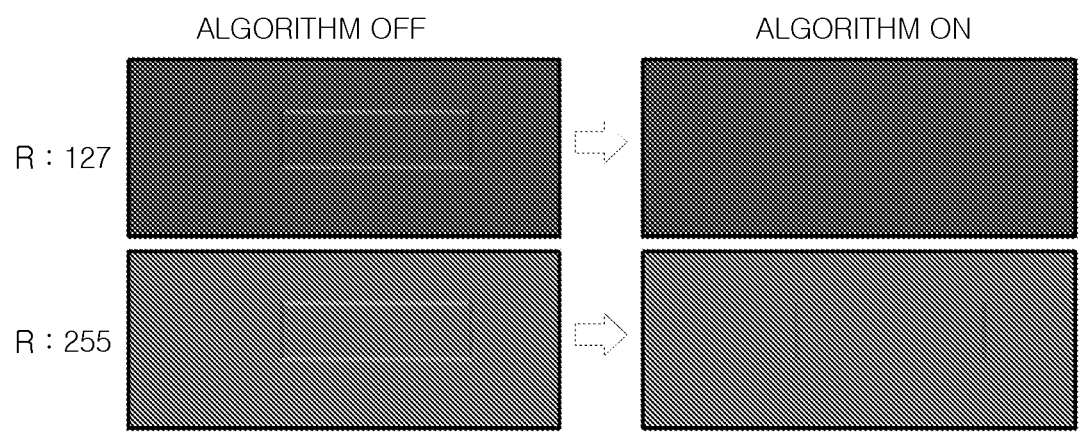
Figure 12A:
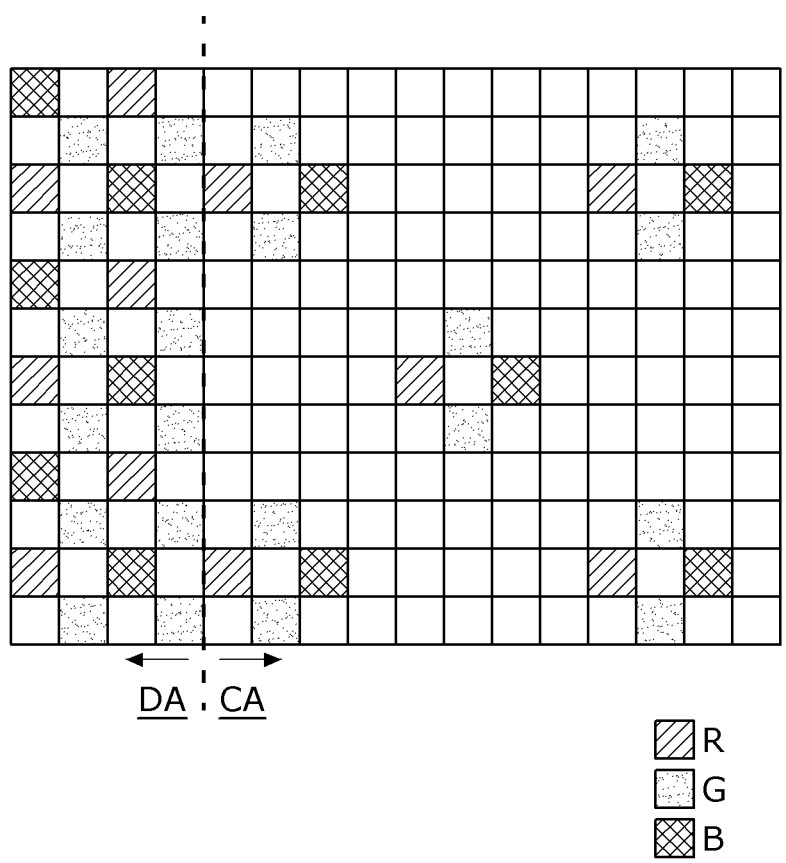
FIGS. 12A and 12B are views for describing a principle of arranging pixels at the boundary portion of the sensing area.
Figure 12B:
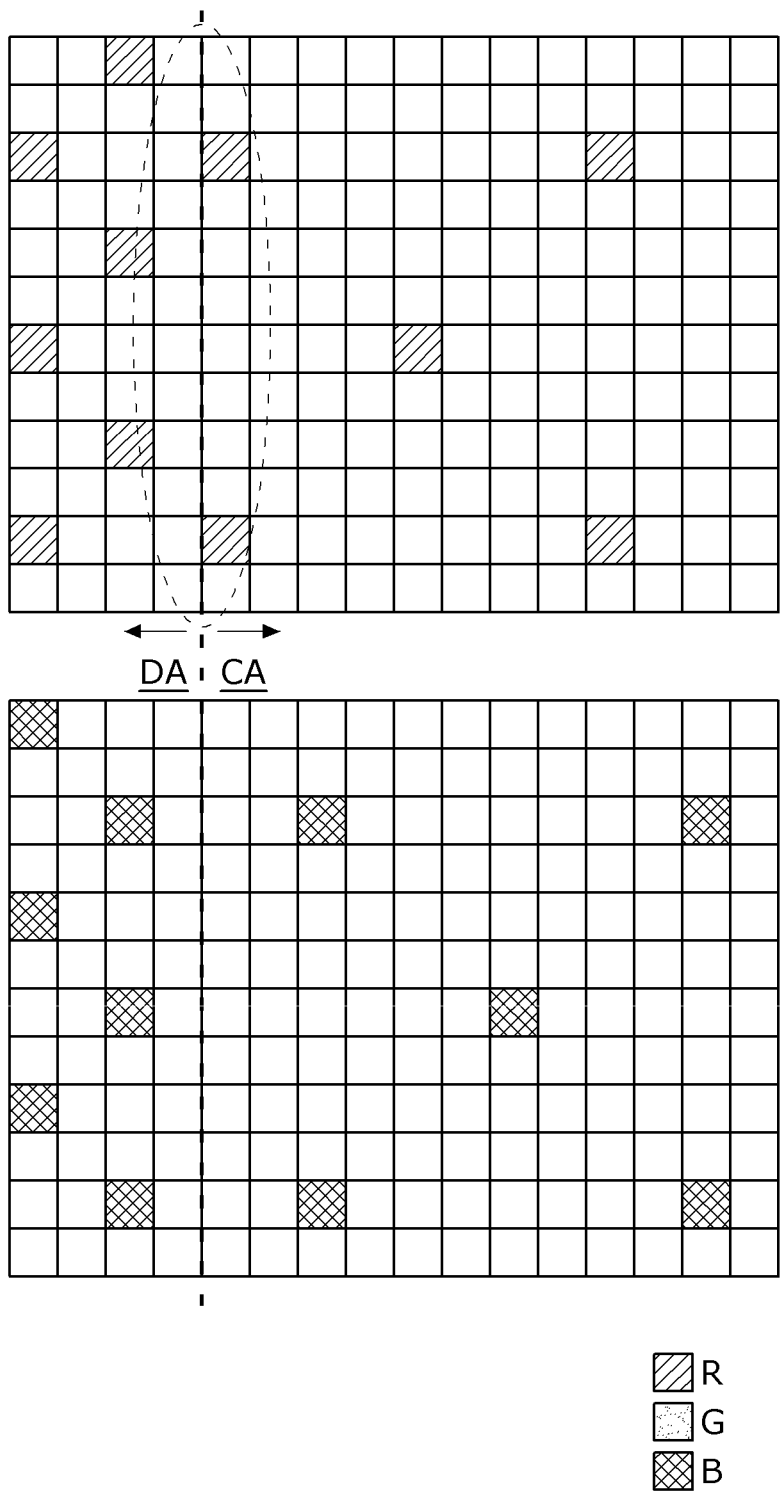

FIG. 9 is a view illustrating a screen including the display area and the sensing area according to the embodiment, FIGS. 10A to 10C are views for describing a principle of arranging pixels at a boundary portion of the sensing area, FIGS. 11A and 11B are views for describing a problem occurring in a pixel structure of FIG. 10A, and FIGS. 12A and 12B are views for describing a principle of arranging pixels at the boundary portion of the sensing area.

Referring to FIG. 9, a screen of the display panel 100 according to the embodiment includes a display area DA and a sensing area CA. Since a PPI of the sensing area CA is lower than a PPI of the display area DA, a difference between the luminances occurs. Thus, a bright line or a dark line may be generated at the boundary between the display area DA and the sensing area CA.

Thus, by applying an algorithm for compensating for a luminance difference at the boundary between the display area DA and the sensing area CA in which the difference between the luminances occurs, recognition of the boundary portion can be reduced or minimized.

Referring to FIG. 10A, when the first pixels or sub-pixels of the first pixels arranged in the display area DA are adjacent to the boundary between the display area DA and the sensing area CA and the second pixels or sub-pixels of the second pixels arranged in the sensing area CA are arranged at a predetermined or selected distance from the boundary, the dark line may be generated. Since there is no pixel line in which the sub-pixels of the second pixel are located at the boundary, it is difficult to perform the compensation using a boundary portion compensation algorithm.

Thus, in order to perform the compensation using the boundary portion compensation algorithm, the sub-pixels of the first pixel arranged in the display area DA and the sub-pixels of the second pixel arranged in the sensing area CA should be arranged adjacent to each other, which means there is not a space enough for arranging a sub-pixel between the two adjacent sub-pixels of the first and second pixels. This is because when the sub-pixels of the first pixel arranged in the display area DA and the sub-pixels of the second pixel arranged in the sensing area CA are arranged adjacent to each other, the bright line is generated at the boundary portion, and in this case, the bright line may be improved through the boundary portion compensation algorithm.

Referring to FIG. 10B, a layout is illustrated in which the first pixel or the sub-pixels of the first pixel arranged in the display area DA and the second pixel or the sub-pixels of the second pixel arranged in the sensing area CA are arranged adjacent to each other at the boundary between the display area DA and the sensing area CA, and the sub-pixels, that is, one B sub-pixel, two G sub-pixels, and one R sub-pixels, of the second pixel are sequentially arranged away from the boundary.

The sub-pixels are disposed in the order of one B sub-pixel among the sub-pixels of the second pixel arranged closest to the display area DA, two G sub-pixels, and one R sub-pixel arranged farther away from the display area DA.

Each of the B-sub pixel, the G sub-pixels, and the R sub-pixel constituting one pixel has a different contribution rate with respect to pixel luminance. The contribution rate is decreased in the order of the G sub-pixels, the R sub-pixel, and the B sub-pixel.

As illustrated in FIG. 10C, due to such contribution rates of the sub-pixels, when the B sub-pixel of the second pixel is arranged adjacent to the boundary between the display area DA and the sensing area CA, as the luminances of the G sub-pixels and the B sub-pixel become lower and the luminance of the R sub-pixel becomes higher, the dark line may be generated at the boundary portion. That is, the dark line may be generated in an area (dotted area) in which the G sub-pixels and the B sub-pixel are arranged.

Referring to FIG. 11A, a bright line may be generated at the boundary between the display area DA and the sensing area CA, and the brightness of an area in which the bright line is generated may be reduced and improved using the boundary portion compensation algorithm.

Referring to FIG. 11B, a dark line may be generated at the boundary between the display area DA and the sensing area CA. In a low gradation, the dark line may be improved by adjusting the compensation gain using the boundary portion compensation algorithm. However, in a high gradation, since the adjusting of the compensation gain is limited, the dark line is not improved and should be maintained without change.

For example, since the boundary portion compensation is performed on the basis of data, when a dark line is generated at a boundary of an 8-bit data image, data is raised to compensate for the dark line. In this case, when 255-gradation data is output, since the data may not be raised, it is difficult to compensate for the dark line.

Thus, in the embodiment, a pixel structure at the boundary between the display area DA and the sensing area CA, which can overcome these limitations, is proposed. That is, in the embodiment, the first pixel of the display area DA and the second pixel of the sensing area CA are arranged adjacent to each other at the boundary between the display area DA and the sensing area CA, and at least one of the R sub-pixel and the G sub-pixels of the second pixel is arranged closest to the display area DA.

Referring to FIG. 12A, the sub-pixels of the first pixel arranged in the display area DA and the sub-pixels of the second pixel arranged in the sensing area CA are arranged adjacent to each other, and the sub-pixels, that is, one R sub-pixel, two G sub-pixels, and one B sub-pixel, of the second pixel are sequentially arranged away from the boundary.

The sub-pixels are disposed in the order of the one R sub-pixel among the sub-pixels of the second pixel arranged closest to the display area DA, the two G sub-pixels, and the one B sub-pixel disposed farther away from the display area.

As illustrated in FIG. 12B, due to luminance contribution rates of the sub-pixels arranged in this manner, when the B sub-pixel is arranged to be spaced apart from the boundary, as the luminances of the G sub-pixels and the B sub-pixel become lower and the luminance of the R sub-pixel becomes higher, the bright line may be generated at the boundary. That is, the bright line may be generated at the boundary (dotted line) between the display area DA and the sensing area CA. Such a bright line may be improved by compensation of reducing the brightness of sub-pixels arranged in the area in which the bright line is generated.

In this case, since the bright line is generated by overlapping the luminances of the sub-pixels of the first pixel disposed in the display area DA and the sub-pixels of the second pixel arranged in the sensing area CA arranged adjacent to the boundary, the bright line is improved by adjusting the brightness of the sub-pixels of the first pixel and the sub-pixels of the second pixel.

Further, a dark line may be generated in the B sub-pixel, but since the luminance contribution rate of the B sub-pixel is relatively low, the dark line caused by the B sub-pixel is not recognized well.

Thus, in the embodiment, a pixel arrangement structure is proposed in which the bright line is generated in the boundary portion.

Figure 14A:
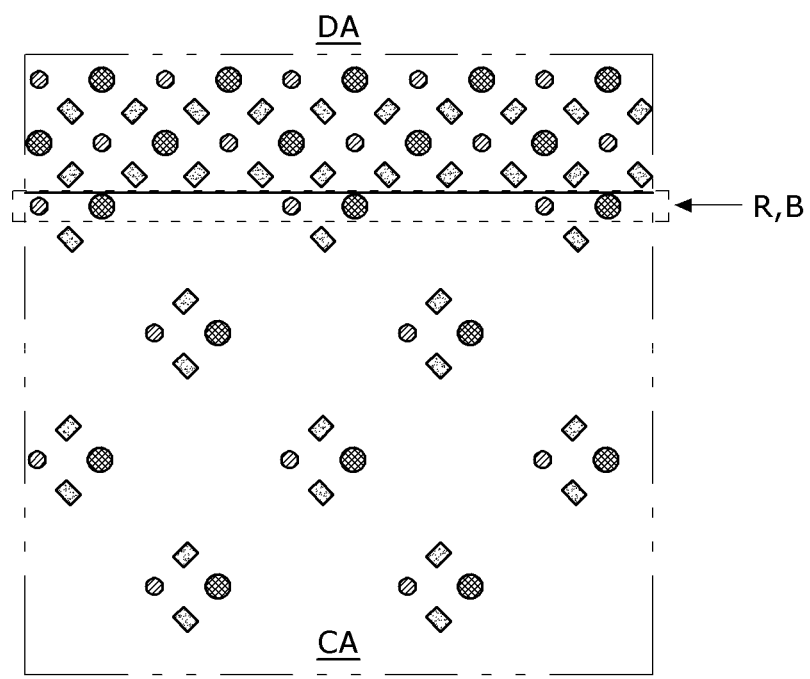
FIGS. 14A to 14R are views for describing a pixel arrangement structure according to the position of the boundary.
Figure 14B:
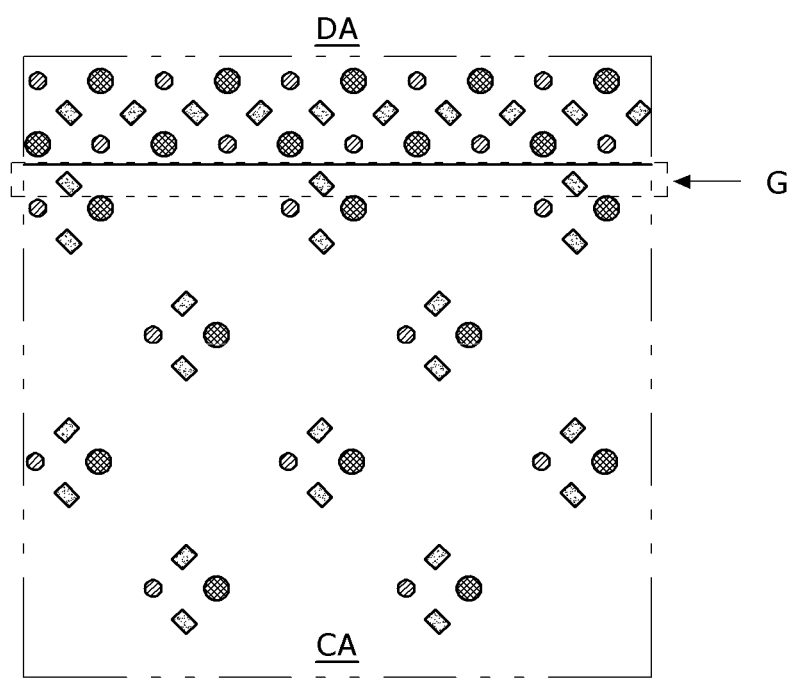
Figure 14C:
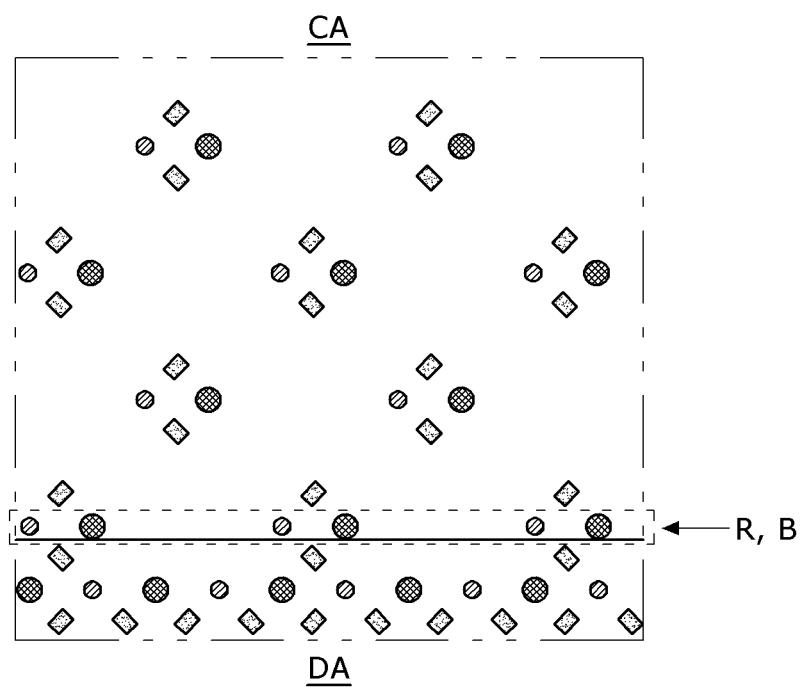
Figure 14D:
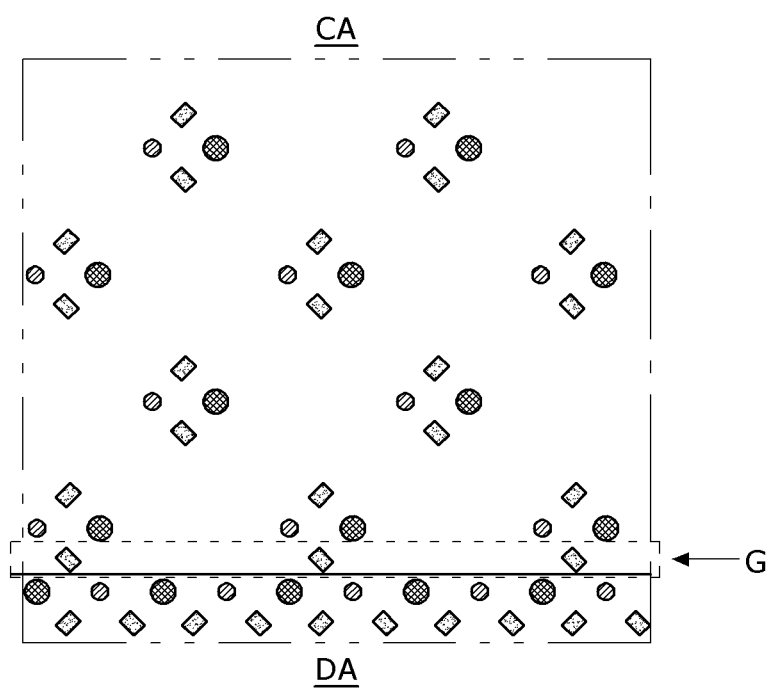
Figure 14E:
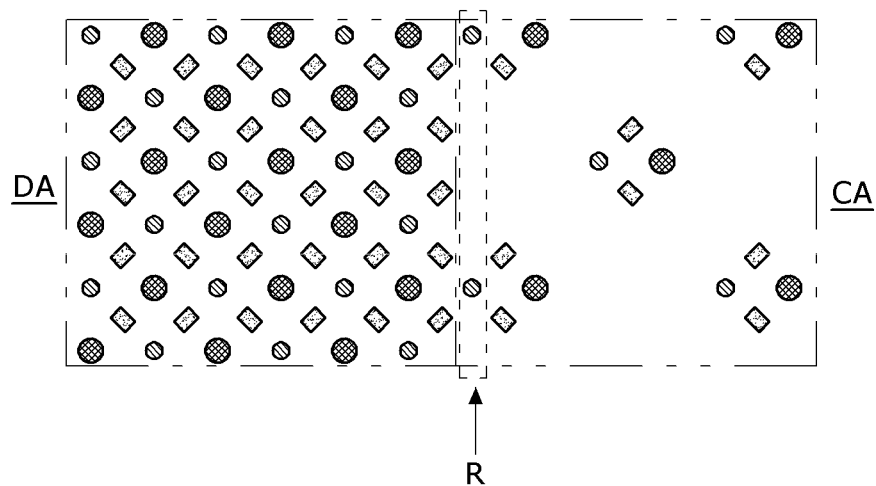
Figure 14F:
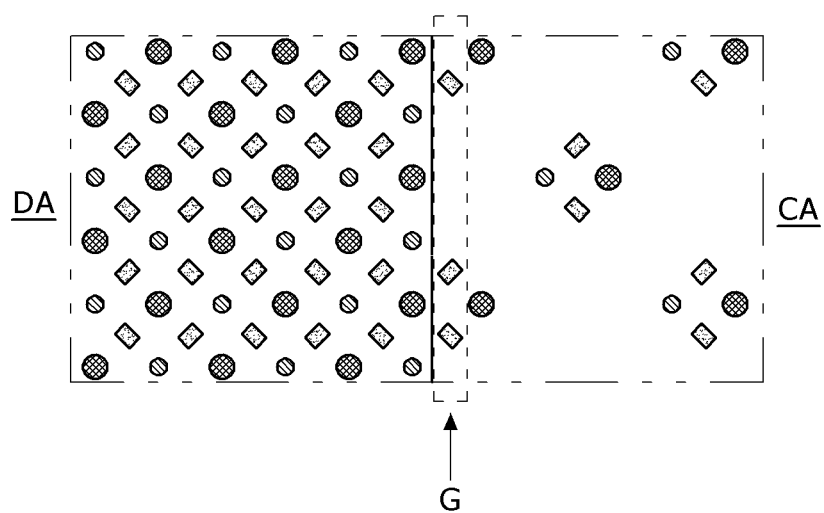
Figure 14G:
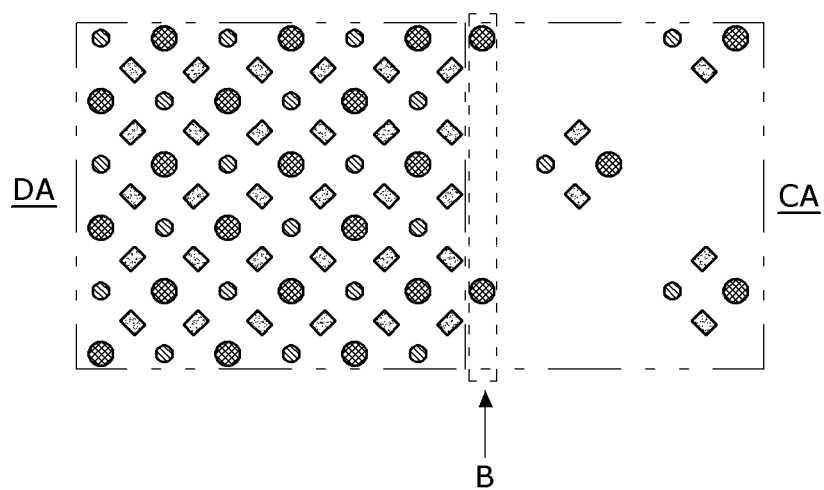
Figure 14H:
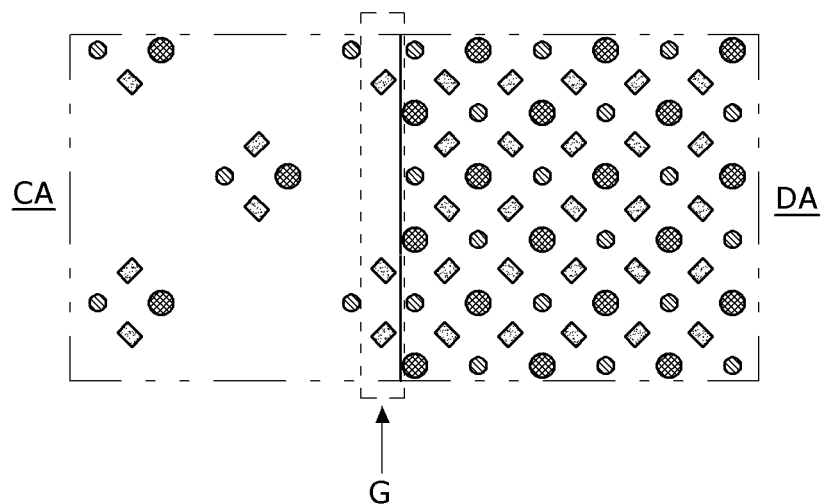
Figure 14I:
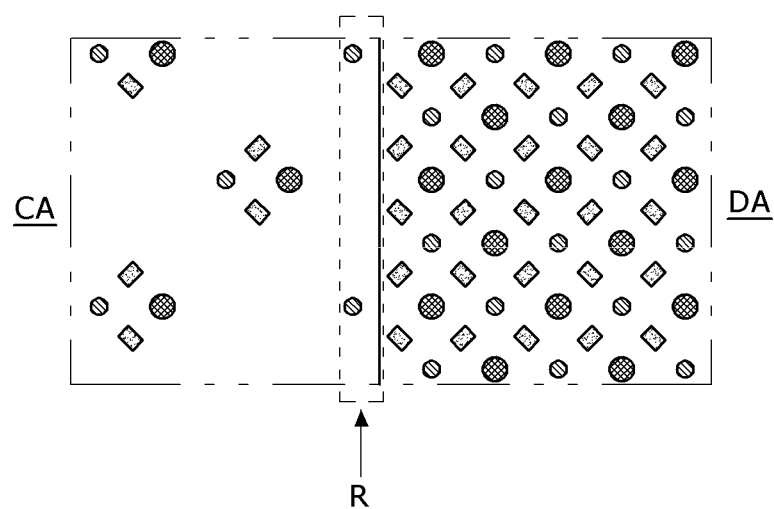
Figure 14J:
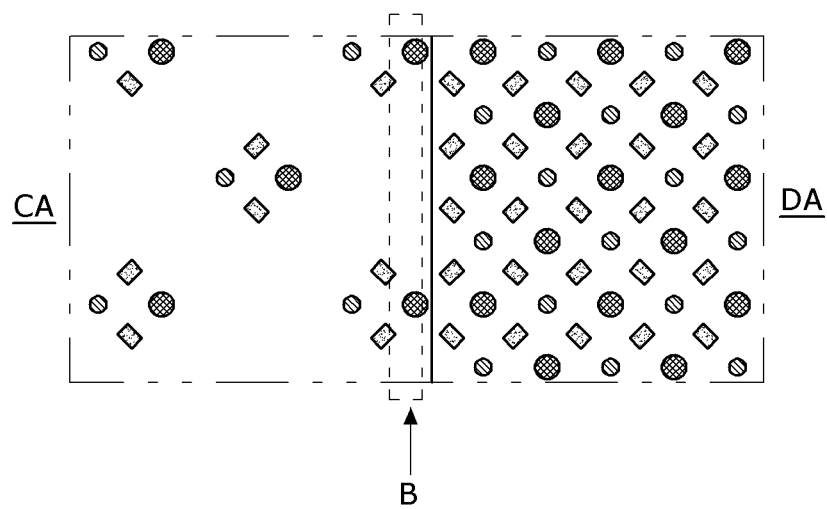
Figure 14K:
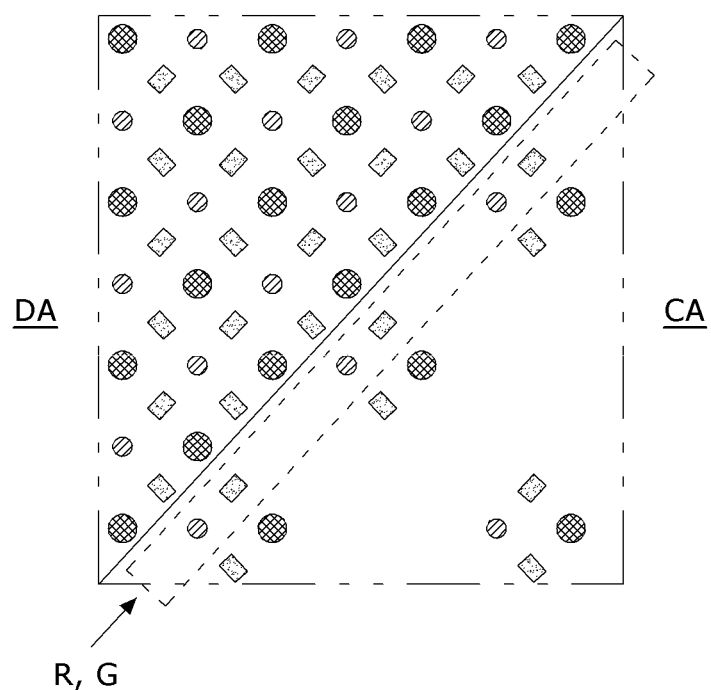
Figure 14L:
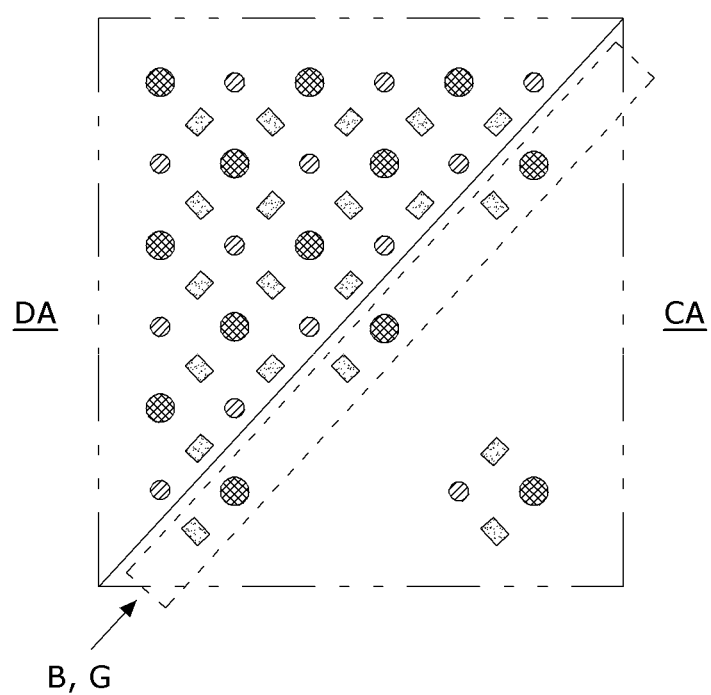
Figure 14M:
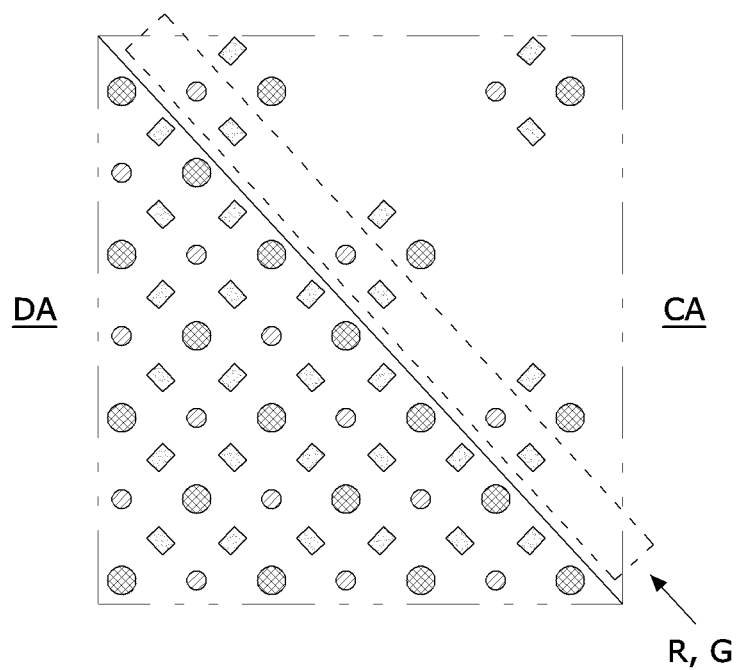
Figure 14N:
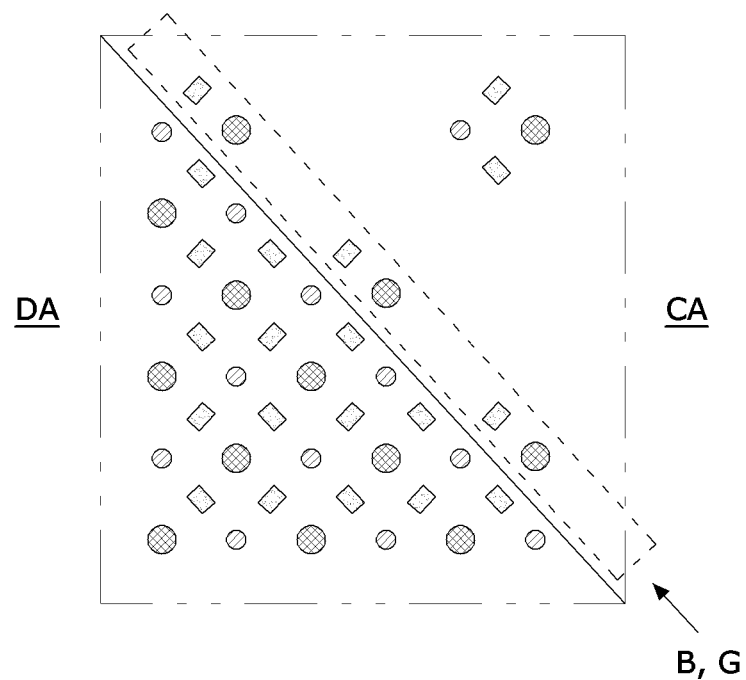

FIG. 13 is a view for describing a pixel arrangement structure at the boundary of the sensing area according to the embodiment, and FIGS. 14A to 14N are views for describing a pixel arrangement structure according to the position of the boundary.

Referring to FIG. 13, at least one of the R sub-pixel and the G sub-pixels among the sub-pixels of the second pixel arranged in the sensing area CA is disposed at the boundary of the sensing area CA according to the embodiment. The sub-pixels of the second pixel arranged adjacent to the boundary may be changed according to positions A1, A2, A3, A4, A5, A6, A7, and A8 in which the display area DA and the sensing area CA are in contact with each other, and hereinafter, a description thereof will be made on the basis of the fact that the contacting positions are roughly classified into first boundaries {A2 and A7}, second boundaries {A4 and A5} and third boundaries {A1, A3, A6, and A8}.

Referring to FIG. 14A, as illustrated in A2 of FIG. 13, the R sub-pixel and the B sub-pixel among the sub-pixels of the second pixel arranged in the sensing area CA may be arranged at a first boundary formed in a first direction in a state in which the display area DA is located on the upper side, the sensing area CA is located on the lower side, and the display area DA and the sensing area CA are in vertical contact with each other. Here, the first direction may be an X-axis direction.

Referring to FIG. 14B, as illustrated in A2 of FIG. 13, the G sub-pixel among the sub-pixels of the second pixel arranged in the sensing area CA may be disposed at the first boundary formed in the first direction in a state in which the display area DA is located on the upper side, the sensing area CA is located on the lower side, and the display area DA and the sensing area CA are in vertical contact with each other.

Referring to FIG. 14C, as illustrated in A7 of FIG. 13, the R sub-pixel and the B sub-pixel among the sub-pixels of the second pixel arranged in the sensing area CA may be arranged at the first boundary formed in the first direction in a state in which the sensing area CA is located on the upper side, the display area DA is located on the lower side, and the display area DA and the sensing area CA are in vertical contact with each other.

Referring to FIG. 14D, as illustrated in A7 of FIG. 13, the G sub-pixel among the sub-pixels of the second pixel arranged in the sensing area CA may be disposed at the first boundary formed in the first direction in a state in which the sensing area CA is located on the upper side, the display area DA is located on the lower side, and the sensing area CA and the display area DA are in vertical contact with each other.

As illustrated in FIGS. 14A to 14D, a line in which the R sub-pixel and the B sub-pixel are arranged or a line in which the one G sub-pixel is disposed may be configured at an outermost part of the sensing area CA at the first boundary in which the display area DA and the sensing area are in vertical contact with each other.

Referring to FIG. 14E, as illustrated in A4 of FIG. 13, the one R sub-pixel among the sub-pixels of the second pixel arranged in the sensing area may be disposed at a second boundary formed in a second direction intersecting the first direction in a state in which the display area DA is located on the left side, the sensing area CA is located on the right side, and the display area DA and the sensing area CA are in contact with each other in a left-right direction. Here, the second direction may be a Y-axis direction that is perpendicular to the first direction as well as a direction tilted from the first direction by a predetermined or selected angle.

Referring to FIG. 14F, as illustrated in A4 of FIG. 13, the two G sub-pixels among the sub-pixels of the second pixel arranged in the sensing area may be arranged at the second boundary formed in the second direction in a state in which the display area DA is located on the left side, the sensing area CA is located on the right side, and the display area DA and the sensing area CA are in contact with each other in the left-right direction.

Referring to FIG. 14G, as illustrated in A4 of FIG. 13, the one B sub-pixel among the sub-pixels of the second pixel arranged in the sensing area CA may be disposed at the second boundary in which the display area DA is located on the left side, the sensing area CA is located on the right side, and the display area DA and the sensing area CA are in contact with each other in the left-right direction.

As illustrated in FIGS. 14E to 14G, a line in which the R sub-pixel is disposed, a line in which the two G sub-pixels are arranged, or a line in which the one B sub-pixel is disposed may be configured at the outermost part of the sensing area CA in the second boundary in which the display area DA and the sensing CA area are in contact with each other in the left-right direction. In some embodiments, including this case, it is beneficial that the one R sub-pixel or the two G sub-pixels are arranged at the outermost part of the sensing area CA, since the dark line may be generated when the B sub-pixel is disposed at the outermost part of the sensing area CA.

Referring to FIG. 14H, as illustrated in A5 of FIG. 13, the two G sub-pixels among the sub-pixels of the second pixel arranged in the sensing area CA may be arranged at the second boundary in which the sensing area CA is located on the left side, the display area DA is located on the right side, and the display area DA and the sensing area CA are in contact with each other in the left-right direction.

Referring to FIG. 14I, as illustrated in A5 of FIG. 13, the one R sub-pixel among the sub-pixels of the second pixel arranged in the sensing area CA may be disposed at the second boundary in which the sensing area CA is located on the left side, the display area DA is located on the right side, and the display area DA and the sensing area CA are in contact with each other in the left-right direction.

Referring to FIG. 14J, as illustrated in A5 of FIG. 13, the one B sub-pixel among the sub-pixels of the second pixel arranged in the sensing area CA may be disposed at the second boundary in which the sensing area CA is located on the left side, the display area DA is located on the right side, and the display area DA and the sensing area CA are in contact with each other in the left-right direction.

As illustrated in FIGS. 14H to 14J, a line in which the R sub-pixel is disposed, a line in which the two G sub-pixels are arranged, or a line in which the one B sub-pixel is disposed may be configured at the outermost part of the sensing area CA at the second boundary in which the display area DA and the sensing area CA are in contact with each other in the left-right direction. In some embodiments, including this case, it is beneficial that the one R sub-pixel or the two G sub-pixels are arranged at the outermost part of the sensing area CA, since the dark line may be generated when the B sub-pixel is disposed at the outermost part of the sensing area CA.

Referring to FIG. 14K, as illustrated in A1 of FIG. 13, the R sub-pixel and the G sub-pixel among the sub-pixels of the second pixel arranged in the sensing area CA may be arranged at a third boundary in which the display area DA is located on the left side, the sensing area CA is located on the right side, and the display area DA and the sensing area CA are in contact with each other obliquely to the left side. Here, in some embodiments, the third boundary is defined as a boundary connecting the first boundary and the second boundary.

Referring to FIG. 14L, as illustrated in A1 of FIG. 13, the B sub-pixel and the G sub-pixel among the sub-pixels of the second pixel arranged in the sensing area CA may be arranged at the third boundary in which the display area DA is located on the left side, the sensing area CA is located on the right side, and the display area DA and the sensing area CA are in contact with each other obliquely to the right side.

Referring to FIG. 14M, as illustrated in A6 of FIG. 13, the R sub-pixel and the G sub-pixel among the sub-pixels of the second pixel arranged in the sensing area CA may be arranged at a third boundary in which the display area DA is located on the left side, the sensing area CA is located on the right side, and the display area DA and the sensing area CA are in contact with each other obliquely to the left side. Here, the third boundary is defined as a boundary connecting the first boundary and the second boundary.

Referring to FIG. 14N, as illustrated in A6 of FIG. 13, the B sub-pixel and the G sub-pixel among the sub-pixels of the second pixel arranged in the sensing area CA may be arranged at the third boundary in which the display area DA is located on the left side, the sensing area CA is located on the right side, and the display area DA and the sensing area CA are in contact with each other obliquely to the right side.

Figure 14O:
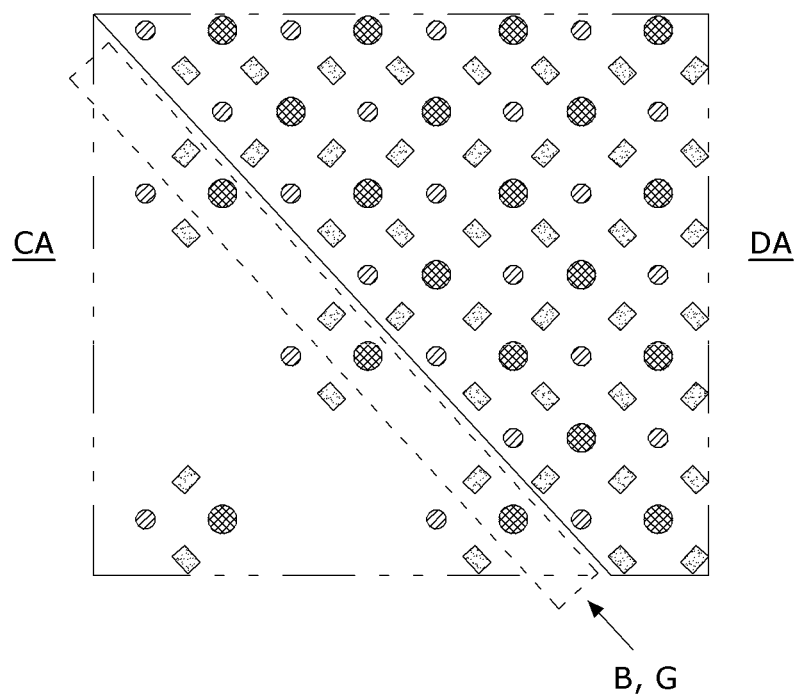

Referring to FIG. 14O, as illustrated in A3 of FIG. 13, the B sub-pixel and the G sub-pixel among the sub-pixels of the second pixel arranged in the sensing area CA may be arranged at the third boundary in which the sensing area CA is located on the left side, the display area DA is located on the right side, and the display area DA and the sensing area CA are in contact with each other obliquely to the right side.

Figure 14P:
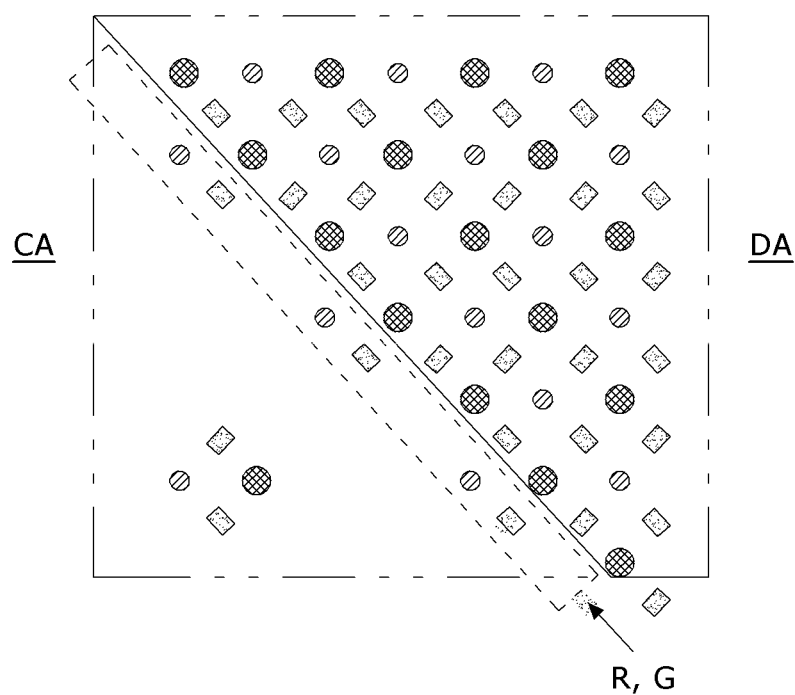

Referring to FIG. 14P, as illustrated in A3 of FIG. 13, the R sub-pixel and the G sub-pixel among the sub-pixels of the second pixel arranged in the sensing area CA may be arranged at the third boundary in which the sensing area CA is located on the left side, the display area DA is located on the right side, and the display area DA and the sensing area CA are in contact with each other obliquely to the left side.

Figure 14Q:
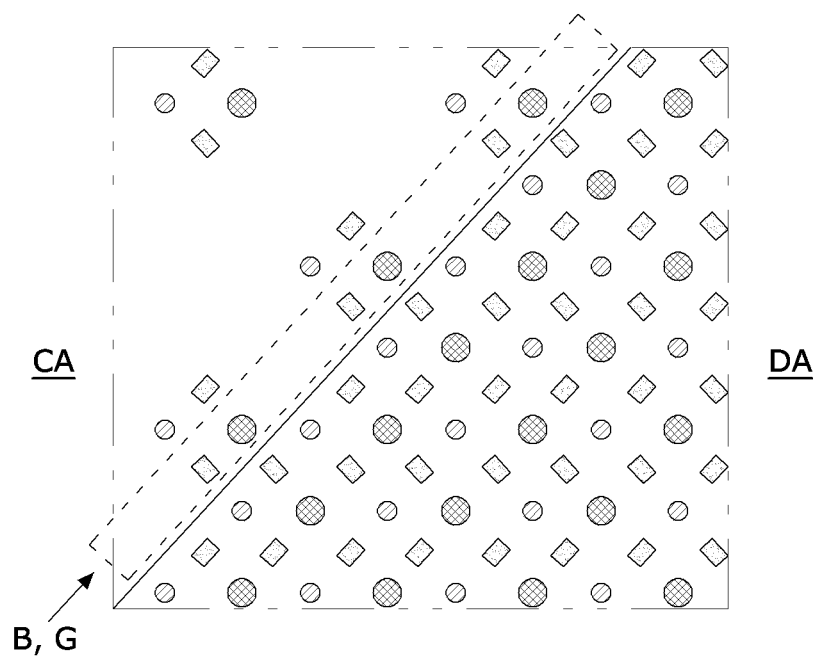

Referring to FIG. 14Q, as illustrated in A8 of FIG. 13, the B sub-pixel and the G sub-pixel among the sub-pixels of the second pixel arranged in the sensing area CA may be arranged at the third boundary in which the sensing area CA is located on the left side, the display area DA is located on the right side, and the display area DA and the sensing area CA are in contact with each other obliquely to the right side.

Figure 14R:
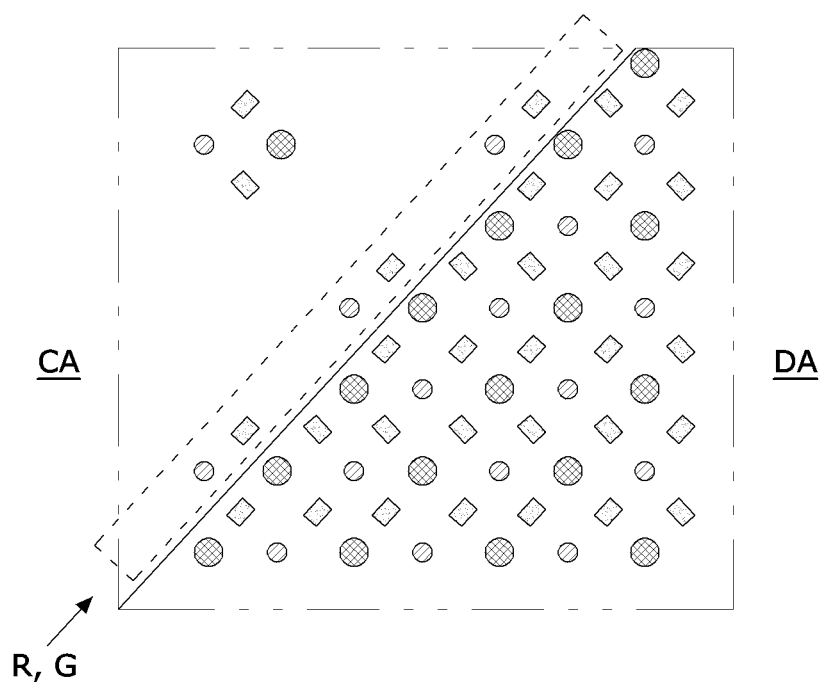

Referring to FIG. 14R, as illustrated in A8 of FIG. 13, the R sub-pixel and the G sub-pixel among the sub-pixels of the second pixel arranged in the sensing area CA may be arranged at the third boundary in which the sensing area CA is located on the left side, the display area DA is located on the right side, and the display area DA and the sensing area CA are in contact with each other obliquely to the left side.

As illustrated in FIGS. 14K to 14R, a line in which the R sub-pixel and the G sub-pixel are arranged or a line in which the B sub-pixel and the G sub-pixel are arranged may be configured at the outermost part of the sensing area CA in the third boundary in which the display area DA and the sensing area are obliquely in contact with each other.

Figure 15A:
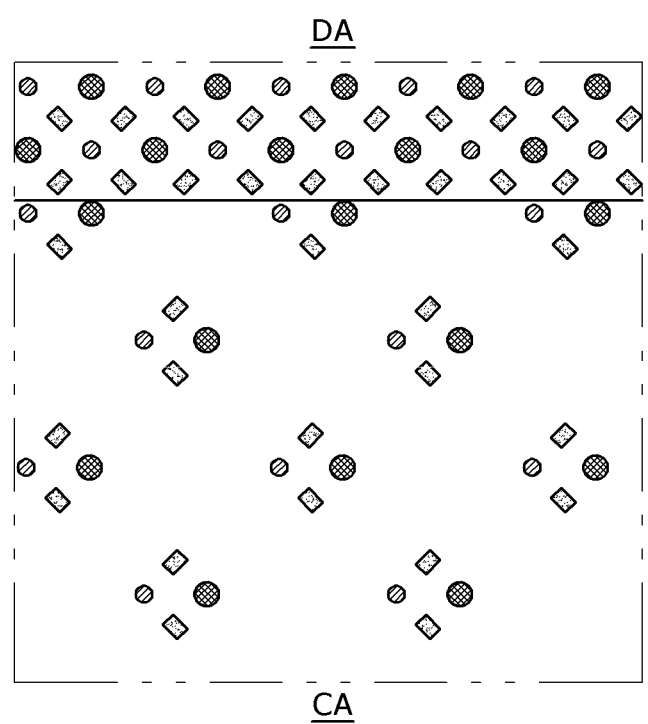
FIGS. 15A to 15C are views for describing a layout of a pixel structure.
Figure 15B:
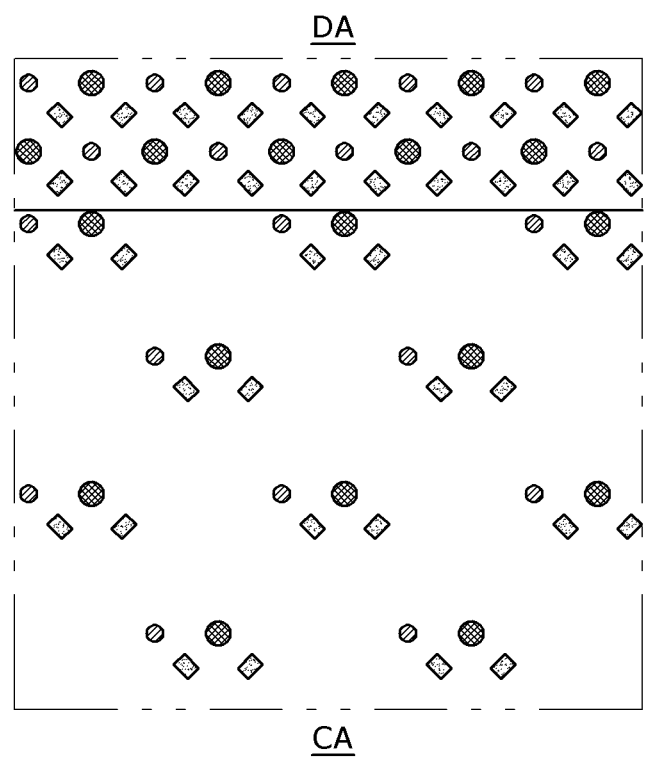
Figure 15C:
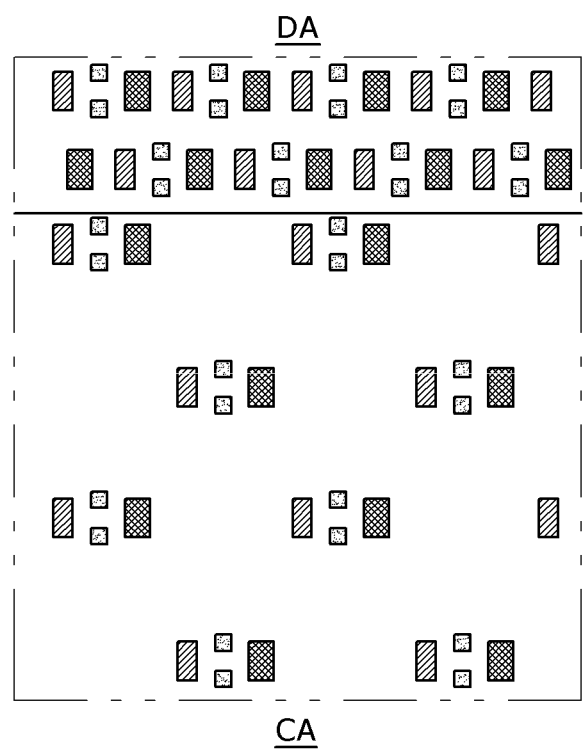

FIGS. 15A to 15C are views for describing a layout of a pixel structure.

Referring to FIG. 15A, a pixel structure according to the embodiment is in the form of RGGB, and in the pixel structure, the one G sub-pixel or the R sub-pixel and the B sub-pixel of the second pixel arranged in the sensing area CA may be arranged in the boundary portion.

Referring to FIG. 15B, a pixel structure according to the embodiment is in the form of RGBG, and in the pixel structure, the two G sub-pixels or the R sub-pixel and the B sub-pixel of the second pixel arranged in the sensing area CA may be arranged in the boundary portion.

Referring to FIG. 15C, a pixel structure according to the embodiment is in the form of RGGB, and in the pixel structure, a line in which the R sub-pixel, the G sub-pixel, and the B sub-pixel of the second pixel arranged in the sensing area CA are arranged may be configured in the boundary portion.

As illustrated in FIGS. 15A to 15C, various types of pixel structure may be applied, but, in some embodiments, it is beneficial that the structure of FIG. 15A in which the R sub-pixel or the G sub-pixel is disposed is applied.

Figure 16:
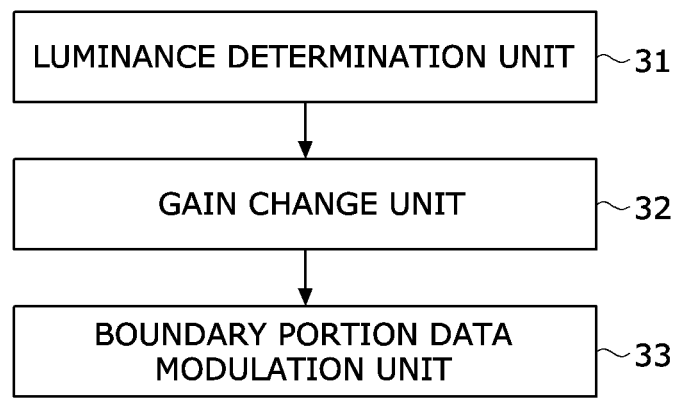
FIG. 16 is a view illustrating a data compensation unit of a timing controller according to the embodiment.
Figure 17A:
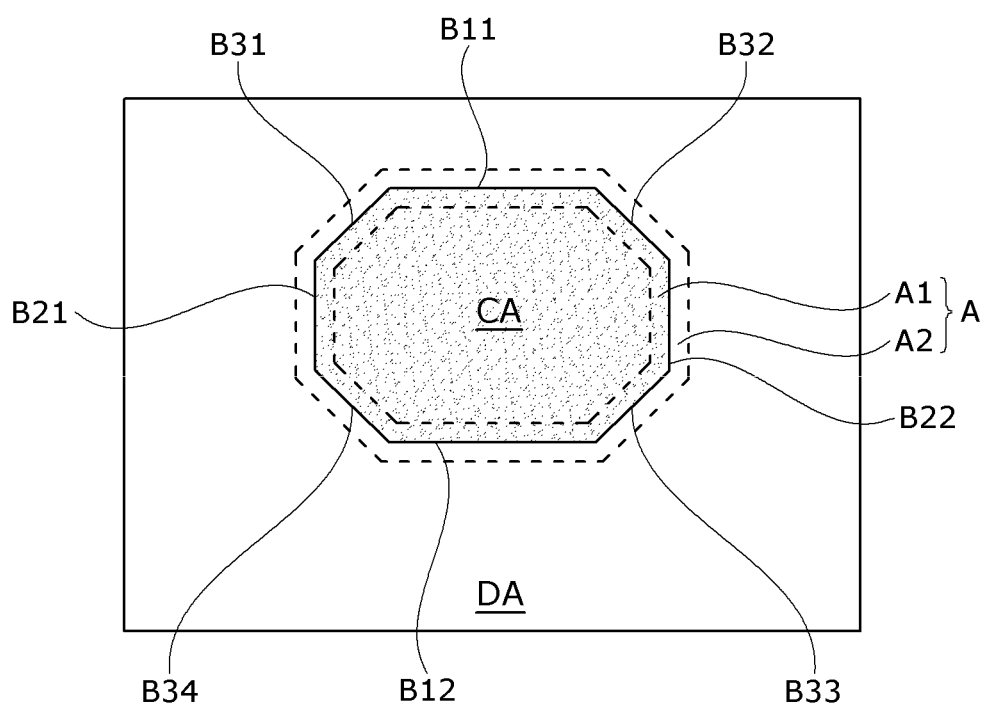
FIGS. 17A and 17B are views for describing a boundary portion compensation area to which a compensation gain is to be applied.
Figure 17B:
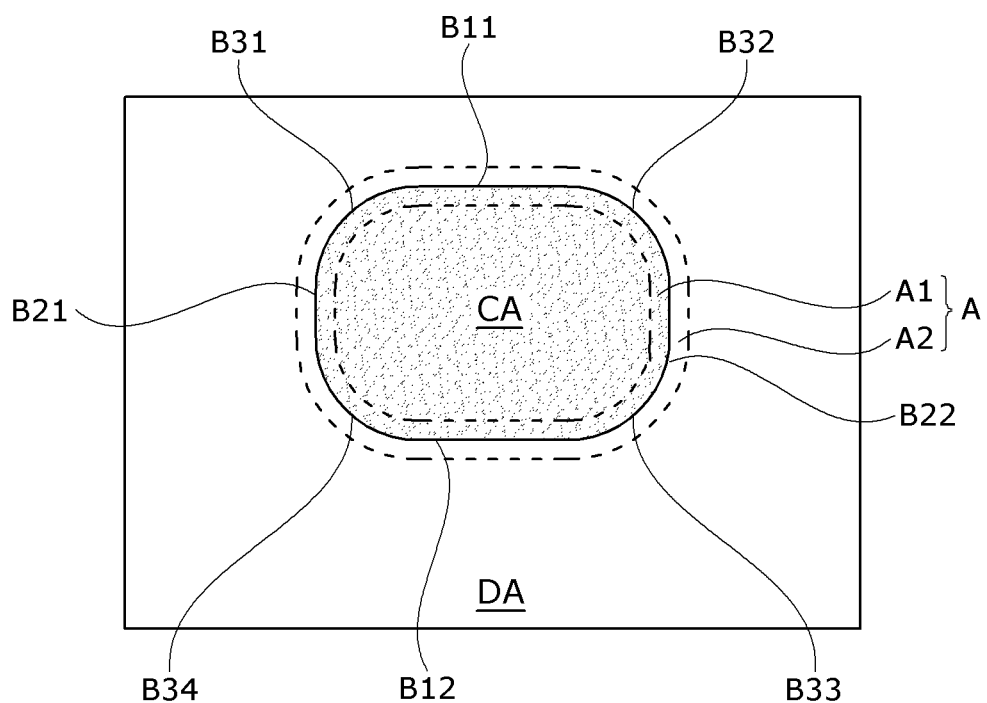

FIG. 16 is a view illustrating a data compensation unit of a timing controller according to the embodiment, and FIGS. 17A and 17B are views for describing a boundary portion compensation area to which a compensation gain is to be applied.

Referring to FIG. 16, the data compensation unit 303a is provided inside the timing controller 303 of FIG. 5 and includes a luminance determination unit 31, a gain change unit 32, and a boundary portion data modulation unit 33.

The luminance determination unit 31 may determine the luminance of the boundary portion compensation area on the basis of the luminance of the pixel data to be written to the pixels in the boundary portion compensation area. Here, the luminance is a value measured while changing a gradation value of data for all expressible entire gradation.

Referring to FIG. 17A, the boundary portion compensation area is an area A including a partial area A1 of the display area DA and a partial area A2 of the sensing area SA, which are adjacent to the boundary between the display area DA and the sensing area SA.

In this case, the boundary may include first boundaries B11 and B12 formed in the first direction, second boundaries B21 and B22 formed in the second direction transverse to the first direction, and third boundaries B31, B32, B33, and B34 connecting the first boundaries and the second boundaries. Here, the third boundary may have a linear line shape. Thus, the boundary may represent the outermost line of the sensing area CA formed in a polygonal shape.

Referring to FIG. 17B, the boundary portion compensation area is the area A including the partial area A1 of the display area DA and the partial area A2 of the sensing area SA, which are adjacent to the boundary between the display area DA and the sensing area SA.

In this case, the boundary may include first boundaries B11 and B12 formed in the first direction, second boundaries B21 and B22 formed in the second direction transverse to the first direction, and third boundaries B31, B32, B33, and B34 connecting the first boundaries and the second boundaries. Here, the third boundary may have a curved line shape. Thus, the boundary may represent the outermost line of the sensing area CA formed in an elliptical shape.

The boundary portion compensation area includes pixels or sub-pixels of the display area DA and the sensing area SA.

The gain change unit 32 compares the luminance of the boundary portion compensation area with the luminance of the display area and the luminance of the sensing area, and when the difference therebetween exceeds a predetermined or selected allowable range, changes the compensation gain applied to the pixel data that is to be written in the first and second pixels.

In this case, the compensation gain is a value for increasing or decreasing the input data at a certain ratio and outputting the input data. The compensation gain may be changed in various values according to the luminance. For example, when the input signal is to be output without change, the compensation gain is set to "1". When the input signal is decreased at a certain ratio and is output, the compensation gain is set to be smaller than 1, and in this case, a bright line is generated. When the input signal is increased at a certain ratio and is output, the compensation gain is set to be larger than 1, and in this case, a dark line is generated.

As an example, when a difference between the luminance of the boundary portion compensation area and the luminance of the display area is larger than the predetermined or selected allowable range and a difference between the luminance of the boundary portion compensation area and the luminance of the sensing area is larger than the predetermined or selected allowable range, the gain change unit 32 may change the compensation gain, which is applied to the pixel data that is to be written in the first and second pixels in the boundary portion compensation area, to a value smaller than 1.

As another example, when a difference between the luminance of the boundary portion compensation area and the luminance of the display area is smaller than the predetermined or selected allowable range and a difference between the luminance of the boundary portion compensation area and the luminance of the sensing area is smaller than the predetermined or selected allowable range, the gain change unit 32 may change the compensation gain, which is applied to the pixel data that is to be written in the first and second pixels in the boundary portion compensation area, to a value greater than 1.

As still another example, when the difference between the luminance of the boundary portion compensation area and the luminance of the display area is larger than the predetermined or selected allowable range and the difference between the luminance of the boundary portion compensation area and the luminance of the sensing area is larger than or not larger than the predetermined or selected allowable range, the gain change unit 32 may change the compensation gain, which is applied to the pixel data that is to be written in all pixels in the sensing area, to a value smaller than 1.

As yet another example, when the difference between the luminance of the boundary portion compensation area and the luminance of the sensing area is smaller than the predetermined or selected allowable range and the difference between the luminance of the boundary portion compensation area and the luminance of the display area is smaller than or not smaller than the predetermined or selected allowable range, the gain change unit 32 may change the compensation gain, which is applied to the pixel data that is to be written in all pixels in the sensing area, to a value greater than 1.

In this case, the gain can be adjusted in units of sub-pixels in a boundary portion compensation area. Thus, the gain change unit 32 may change the compensation gain for the sub-pixels of the display area and the sub-pixels of the sensing area included in the boundary portion compensation area.

Further, the compensation gain may be changed according to the luminance of the boundary portion compensation area on the basis of the luminance of the pixel data that is to be written in the pixels in the boundary portion compensation area, but the present disclosure is not limited thereto, and the compensation gain may be a representative value predetermined or selected in consideration of the average characteristics of the bright line in the boundary portion.

The boundary portion data modulation unit 33 may modulate the pixel data that is to be written in each of the sub-pixels of the first pixel and the second pixel using the compensation gain from the gain change unit 32. That is, the boundary portion data modulation unit 33 may perform modulation by multiplying the compensation gain by the pixel data.

For example, when the gradation of the input data is 255 and the compensation gain is adjusted to be less than "1," the gradation of output data may be adjusted to be maintained or lowered as represented in Table 1.

TABLE 1

| Compensation gain | 1.0 | 0.85 | 0.65 | 0.5 | 0 |
|---|---|---|---|---|---|
| Gradation of output data | 255 | 217 | 166 | 128 | 0 |

In embodiments, a first pixel in a display area in which a plurality of first pixels are arranged at a first PPI and a second pixel in a sensing area in which a plurality of first pixels are arranged at a second PPI that is smaller than the first PPI are arranged adjacent to each other at a boundary between the display area and the sensing area, the second pixel includes R, G and B sub-pixels, and at least one of a R sub-pixel, a G sub-pixel and a B sub-pixel of the second pixel is arranged closest to the display area, and thus a boundary portion compensation algorithm can be applied.

In some embodiments, at least one of the R sub-pixel and the G sub-pixel of the second pixel is arranged closest to the display and a bright line is generated at the boundary. Therefore, a boundary portion compensation algorithm can be easily applied. In such embodiments, the boundary portion compensation algorithm is applied to decrease the luminance of an area of the boundary portion in which the bright line is generated, and thus the bright difference and color difference in the boundary portion can be improved.

Although the embodiments of the present disclosure have been described in more detail with reference to the accompanying drawings, the present disclosure is not limited thereto and may be embodied in many different forms without departing from the technical concept of the present disclosure. Therefore, the embodiments disclosed in the present disclosure are provided for illustrative purposes only and are not intended to limit the technical concept of the present disclosure. The scope of the technical concept of the present disclosure is not limited thereto. Therefore, it should be understood that the above-described embodiments are illustrative in all aspects and do not limit the present disclosure. The protective scope of the present disclosure should be construed based on all the technical concepts disclosed in the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
a display area including a plurality of first pixels; and
a sensing area including a plurality of second pixels and a plurality of light transmitting parts alternately arranged with the plurality of second pixels,
wherein the plurality of light transmitting parts includes transparent insulating materials without a metal in the light transmitting parts, and
wherein a distance between the adjacent light transmitting parts is smaller than a distance between the adjacent second pixels.

2. The display device of claim 1, wherein each of the second pixels includes red, green, and blue sub-pixels, and
wherein at least one of the red and green sub-pixels of the each of the second pixels is arranged closest to the display area.

3. The display device of claim 2, wherein the first pixels and the second pixels are arranged in a boundary compensation area adjacent to a boundary between the display area and the sensing area, and
wherein a compensation gain for pixel data that is to be written in at least one of the first pixels and the second pixels in the boundary compensation area is changed from a first value to a second value.

4. The display device of claim 3, further comprising a controller that sets the boundary compensation area and changes the compensation gain for pixel data that is to be written in the first pixels and the second pixels.

5. A display device, comprising:
a display area including a plurality of first pixels; and
a sensing area including a plurality of second pixels and a plurality of light transmitting parts alternately arranged with the plurality of second pixels, wherein the plurality of light transmitting parts includes transparent insulating materials without a metal in the light transmitting parts, wherein each of the light transmitting parts has a circle, an ellipse, or a polygon shape, and wherein one of the plurality of second pixels is surrounded by four of the plurality of light transmitting parts.

6. The display device of claim 5, wherein each of the second pixels includes red, green, and blue sub-pixels, and wherein at least one of the red and green sub-pixels of the each of the second pixels is arranged closest to the display area.

7. The display device of claim 6, wherein the first pixels and the second pixels are arranged in a boundary compensation area adjacent to a boundary between the display area and the sensing area, and wherein a compensation gain for pixel data that is to be written in at least one of the first pixels and the second pixels in the boundary compensation area is changed from a first value to a second value.

8. The display device of claim 7, further comprising a controller that sets the boundary compensation area and changes the compensation gain for pixel data that is to be written in the first pixels and the second pixels.

* * * * *